United States Patent
Qian

(10) Patent No.: US 10,216,890 B2
(45) Date of Patent: *Feb. 26, 2019

(54) INTEGRATED CIRCUITS HAVING IN-SITU CONSTRAINTS

(71) Applicant: IYM Technologies LLC, Suffern, NY (US)

(72) Inventor: Qi-De Qian, Santa Clara, CA (US)

(73) Assignee: IYM Technologies LLC, West Harrison, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/903,674

(22) Filed: Feb. 23, 2018

(65) Prior Publication Data

US 2018/0181699 A1    Jun. 28, 2018

Related U.S. Application Data

(63) Continuation of application No. 15/715,097, filed on Sep. 25, 2017, which is a continuation of application
(Continued)

(51) Int. Cl.
*G06F 17/50* (2006.01)
*H01L 27/02* (2006.01)

(52) U.S. Cl.
CPC ...... *G06F 17/5081* (2013.01); *G06F 17/5068* (2013.01); *G06F 17/5072* (2013.01); *G06F 17/5077* (2013.01); *H01L 27/0207* (2013.01)

(58) Field of Classification Search
CPC ............. G06F 17/5081; G06F 17/5072; G06F 17/5068; G06F 17/5077; H01L 27/0207
See application file for complete search history.

(56) References Cited

U.S. PATENT DOCUMENTS

T938,005 I4    9/1975    Colton et al.
3,983,479 A    9/1976    Lee et al.
(Continued)

FOREIGN PATENT DOCUMENTS

CN    103885282 A    6/2014
EP    1199651 A2    11/1998
(Continued)

OTHER PUBLICATIONS

Allan et al., "An Yield Improvement Technique for IC Layout Using Local Design Rules"; IEEE transactions on computer-aided design, vol. 11, No. 11, Nov. 1992, pp. 1355-1362.*
(Continued)

*Primary Examiner* — Naum Levin
(74) *Attorney, Agent, or Firm* — Tully Rinckey PLLC; Steven M. Hoffberg

(57) ABSTRACT

In accordance with the present method and system for improving integrated circuit layout, a local process modification is calculated from simulated process response variables at a set of control points. Said modification values are incorporated into the layout constraints imposed by design rules and design intent to account for manufacturing friendliness. Solving the updated constraint equation with user specified objective function produces a new layout with increased manufacturability. The new layout may further contain data tags that enable optimal process correction to be performed on selected locations, leading to reduction in data size and mask complexity. Also in accordance with this invention, physical design tools are enhanced to read and process anisotropic design rules.

25 Claims, 8 Drawing Sheets

Related U.S. Application Data

No. 15/251,961, filed on Aug. 30, 2016, now Pat. No. 9,798,853, which is a continuation of application No. 13/886,577, filed on May 3, 2013, now Pat. No. 9,697,317, which is a continuation of application No. 13/547,444, filed on Jul. 12, 2012, now Pat. No. 8,464,187, which is a continuation of application No. 12/181,483, filed on Jul. 29, 2008, now Pat. No. 8,266,557, which is a continuation-in-part of application No. 10/907,814, filed on Apr. 15, 2005, now Pat. No. 7,448,012.

(60) Provisional application No. 60/603,758, filed on Aug. 23, 2004, provisional application No. 60/564,082, filed on Apr. 21, 2004.

(56) References Cited

U.S. PATENT DOCUMENTS

| | | |
|---|---|---|
| 4,346,695 A | 8/1982 | Kitzmiller |
| 4,346,723 A | 8/1982 | Geiger |
| 4,346,817 A | 8/1982 | Karcher |
| 4,441,207 A | 4/1984 | Lougheed et al. |
| 4,584,653 A | 4/1986 | Chih et al. |
| 4,742,471 A | 5/1988 | Yoffa et al. |
| 4,754,105 A | 6/1988 | Doty et al. |
| 4,761,607 A | 8/1988 | Shiragasawa et al. |
| 4,803,636 A | 2/1989 | Nishiyama et al. |
| 4,823,276 A | 4/1989 | Hiwatashi |
| 4,827,428 A | 5/1989 | Dunlop et al. |
| 4,852,015 A | 7/1989 | Doyle, Jr. |
| 4,882,690 A | 11/1989 | Shinsha et al. |
| 4,882,999 A | 11/1989 | Azukizawa et al. |
| 4,965,739 A | 10/1990 | Ng |
| 4,965,863 A | 10/1990 | Cray |
| 5,018,074 A | 5/1991 | Griffith et al. |
| 5,021,847 A | 6/1991 | Eitan et al. |
| 5,046,109 A | 9/1991 | Fujimori et al. |
| 5,075,753 A | 12/1991 | Kozono |
| 5,079,717 A | 1/1992 | Miwa |
| 5,086,477 A | 2/1992 | Yu et al. |
| 5,097,422 A | 3/1992 | Corbin, II et al. |
| 5,119,169 A | 6/1992 | Kozono et al. |
| 5,124,273 A | 6/1992 | Minami |
| 5,197,116 A | 3/1993 | Katoh et al. |
| 5,210,701 A | 5/1993 | Hana et al. |
| 5,212,653 A | 5/1993 | Tanaka |
| 5,218,551 A | 6/1993 | Agrawal et al. |
| 5,237,514 A | 8/1993 | Curtin |
| 5,241,185 A | 8/1993 | Meiri et al. |
| 5,247,455 A | 9/1993 | Yoshikawa |
| 5,247,456 A | 9/1993 | Ohe et al. |
| 5,258,920 A | 11/1993 | Haller et al. |
| 5,267,177 A | 11/1993 | Sato et al. |
| 5,281,558 A | 1/1994 | Bamji et al. |
| 5,282,140 A | 1/1994 | Tazawa et al. |
| 5,295,082 A | 3/1994 | Chang et al. |
| 5,303,161 A | 4/1994 | Burns et al. |
| 5,303,471 A | 4/1994 | Liberatoscioli |
| 5,308,722 A | 5/1994 | Nistler |
| 5,309,371 A | 5/1994 | Shikata et al. |
| 5,311,443 A | 5/1994 | Crain et al. |
| 5,326,659 A | 7/1994 | Liu et al. |
| 5,331,572 A | 7/1994 | Takahashi |
| 5,345,444 A | 9/1994 | Cloonan et al. |
| 5,353,235 A | 10/1994 | Do et al. |
| 5,369,596 A | 11/1994 | Tokumaru |
| 5,376,483 A | 12/1994 | Rolfson |
| 5,379,348 A | 1/1995 | Watanabe et al. |
| 5,381,343 A | 1/1995 | Bamji et al. |
| 5,384,710 A | 1/1995 | Lam et al. |
| 5,388,054 A | 2/1995 | Tokumaru |
| 5,402,358 A | 3/1995 | Smith et al. |
| 5,416,717 A | 5/1995 | Miyama et al. |
| 5,416,722 A | 5/1995 | Edwards |
| 5,422,317 A | 6/1995 | Hua et al. |
| 5,438,524 A | 8/1995 | Komoda |
| 5,441,834 A | 8/1995 | Takekuma et al. |
| 5,442,569 A | 8/1995 | Osano |
| 5,442,714 A | 8/1995 | Iguchi |
| 5,459,673 A | 10/1995 | Carmean et al. |
| 5,481,474 A | 1/1996 | Lee |
| 5,481,624 A | 1/1996 | Kamon |
| 5,490,268 A | 2/1996 | Matsunaga |
| 5,493,509 A | 2/1996 | Matsumoto et al. |
| 5,493,510 A | 2/1996 | Shikata |
| 5,519,628 A | 5/1996 | Russell et al. |
| 5,526,517 A | 6/1996 | Jones et al. |
| 5,533,148 A | 7/1996 | Sayah et al. |
| 5,535,134 A | 7/1996 | Cohn et al. |
| 5,541,025 A | 7/1996 | Oi et al. |
| 5,541,914 A | 7/1996 | Krishnamoorthy et al. |
| 5,559,718 A | 9/1996 | Baisuck et al. |
| 5,559,997 A | 9/1996 | Tsuchida et al. |
| 5,568,396 A | 10/1996 | Bamji et al. |
| 5,572,598 A | 11/1996 | Wihl et al. |
| 5,572,710 A | 11/1996 | Asano et al. |
| 5,579,237 A | 11/1996 | Shibuya |
| 5,581,474 A | 12/1996 | Bamji et al. |
| 5,604,680 A | 2/1997 | Bamji et al. |
| 5,610,831 A | 3/1997 | Matsumoto |
| 5,612,893 A | 3/1997 | Hao et al. |
| 5,619,419 A | 4/1997 | DHaeseleer et al. |
| 5,625,567 A | 4/1997 | Mankin et al. |
| 5,629,859 A | 5/1997 | Agarwala et al. |
| 5,631,842 A | 5/1997 | Habra et al. |
| 5,633,807 A | 5/1997 | Fishburn et al. |
| 5,636,129 A | 6/1997 | Her |
| 5,636,132 A | 6/1997 | Kamdar |
| 5,654,895 A | 8/1997 | Olnowich et al. |
| 5,663,891 A | 9/1997 | Bamji et al. |
| 5,663,892 A | 9/1997 | Hayashi et al. |
| 5,680,588 A | 10/1997 | Gortych et al. |
| 5,682,321 A | 10/1997 | Ding et al. |
| 5,686,208 A | 11/1997 | Le et al. |
| 5,689,433 A | 11/1997 | Edwards |
| 5,691,913 A | 11/1997 | Tsuchida et al. |
| 5,694,328 A | 12/1997 | Hayashi et al. |
| 5,695,896 A | 12/1997 | Pierrat |
| 5,701,255 A | 12/1997 | Fukui |
| 5,723,235 A | 3/1998 | Tsudaka et al. |
| 5,725,974 A | 3/1998 | Kawahira |
| 5,726,903 A | 3/1998 | Kerzman et al. |
| 5,729,466 A | 3/1998 | Bamji |
| 5,745,374 A | 4/1998 | Matsumoto |
| 5,751,554 A | 5/1998 | Williams et al. |
| 5,761,075 A | 6/1998 | Oi et al. |
| 5,764,530 A | 6/1998 | Yokomaku |
| 5,768,146 A | 6/1998 | Jassowski |
| 5,774,133 A | 6/1998 | Neave et al. |
| 5,795,688 A | 8/1998 | Burdorf et al. |
| 5,798,541 A | 8/1998 | Jassowski |
| 5,798,936 A | 8/1998 | Cheng |
| 5,801,954 A | 9/1998 | Le et al. |
| 5,801,959 A | 9/1998 | Ding et al. |
| 5,805,860 A | 9/1998 | Parham |
| 5,808,898 A | 9/1998 | Kajitani et al. |
| 5,812,162 A | 9/1998 | Silverbrook |
| 5,812,412 A | 9/1998 | Moriizumi et al. |
| 5,818,729 A | 10/1998 | Wang et al. |
| 5,825,385 A | 10/1998 | Silverbrook |
| 5,825,660 A | 10/1998 | Cagan et al. |
| 5,825,661 A | 10/1998 | Drumm |
| 5,841,452 A | 11/1998 | Silverbrook |
| 5,841,898 A | 11/1998 | Liguori |
| 5,845,233 A | 12/1998 | Fishburn |
| 5,850,241 A | 12/1998 | Silverbrook |
| 5,856,925 A | 1/1999 | Maeda et al. |
| 5,880,967 A | 3/1999 | Jyu et al. |
| 5,887,155 A | 3/1999 | Laidig |
| 5,889,681 A | 3/1999 | Suda |
| 5,889,686 A | 3/1999 | Mimotogi et al. |
| 5,896,300 A | 4/1999 | Raghavan et al. |
| 5,903,031 A | 5/1999 | Yamada et al. |

(56) References Cited

U.S. PATENT DOCUMENTS

| | | |
|---|---|---|
| 5,903,461 A | 5/1999 | Rostoker et al. |
| 5,905,517 A | 5/1999 | Silverbrook |
| 5,923,569 A | 7/1999 | Kumashiro et al. |
| 5,926,397 A | 7/1999 | Yamanouchi |
| 5,930,499 A | 7/1999 | Chen et al. |
| 5,933,566 A | 8/1999 | Kishi et al. |
| 5,936,868 A | 8/1999 | Hall |
| 5,953,517 A | 9/1999 | Yin et al. |
| 5,959,871 A | 9/1999 | Pierzchala et al. |
| 5,963,455 A | 10/1999 | Scepanovic et al. |
| 5,965,306 A | 10/1999 | Mansfield et al. |
| 5,970,238 A | 10/1999 | Shibata et al. |
| 5,974,244 A | 10/1999 | Hayashi et al. |
| 5,974,245 A | 10/1999 | Li et al. |
| 5,984,510 A | 11/1999 | Guruswamy et al. |
| 5,987,240 A | 11/1999 | Kay |
| 5,990,691 A | 11/1999 | Joerg et al. |
| 5,995,734 A | 11/1999 | Saika |
| 5,998,068 A | 12/1999 | Matsuoka |
| 6,006,024 A | 12/1999 | Guruswamy et al. |
| 6,009,250 A | 12/1999 | Ho et al. |
| 6,009,251 A | 12/1999 | Ho et al. |
| 6,009,252 A | 12/1999 | Lipton |
| 6,011,911 A | 1/2000 | Ho et al. |
| 6,014,506 A | 1/2000 | Hossain et al. |
| 6,016,357 A | 1/2000 | Neary et al. |
| 6,019,457 A | 2/2000 | Silverbrook |
| 6,026,223 A | 2/2000 | Scepanovic et al. |
| 6,031,980 A | 2/2000 | Oota |
| 6,035,108 A | 3/2000 | Kikuchi |
| 6,045,710 A | 4/2000 | Silverbrook |
| 6,066,179 A | 5/2000 | Allan |
| 6,077,308 A | 6/2000 | Carter et al. |
| 6,077,310 A | 6/2000 | Yamamoto et al. |
| 6,078,738 A | 6/2000 | Garza et al. |
| 6,080,201 A | 6/2000 | Hojat et al. |
| 6,080,204 A | 6/2000 | Mendel |
| 6,083,275 A | 7/2000 | Heng et al. |
| 6,086,630 A | 7/2000 | Williams et al. |
| 6,086,631 A | 7/2000 | Chaudhary et al. |
| 6,091,072 A | 7/2000 | Dick et al. |
| 6,091,723 A | 7/2000 | Even |
| 6,091,845 A | 7/2000 | Pierrat et al. |
| 6,091,892 A | 7/2000 | Xue et al. |
| 6,099,583 A | 8/2000 | Nag |
| 6,110,222 A | 8/2000 | Minami et al. |
| 6,127,071 A | 10/2000 | Lu |
| 6,130,383 A | 10/2000 | Lamourelle |
| 6,154,873 A | 11/2000 | Takahashi |
| 6,155,725 A | 12/2000 | Scepanovic et al. |
| 6,171,731 B1 | 1/2001 | Medvedeva et al. |
| 6,178,360 B1 | 1/2001 | Pierrat et al. |
| 6,189,132 B1 | 2/2001 | Heng et al. |
| 6,205,571 B1 | 3/2001 | Camporese et al. |
| 6,208,907 B1 | 3/2001 | Durham et al. |
| 6,209,123 B1 | 3/2001 | Maziasz et al. |
| 6,223,332 B1 | 4/2001 | Scepanovic et al. |
| 6,225,025 B1 | 5/2001 | Hoshino |
| 6,230,304 B1 | 5/2001 | Groeneveld et al. |
| 6,237,128 B1 | 5/2001 | Folberth et al. |
| 6,237,133 B1 | 5/2001 | Suzuki |
| 6,249,597 B1 | 6/2001 | Tsudaka |
| 6,249,902 B1 | 6/2001 | Igusa et al. |
| 6,249,904 B1 | 6/2001 | Cobb |
| 6,261,728 B1 | 7/2001 | Lin |
| 6,269,277 B1 | 7/2001 | Hershenson et al. |
| 6,269,280 B1 | 7/2001 | Miyanishi et al. |
| 6,272,236 B1 | 8/2001 | Pierrat et al. |
| 6,272,392 B1 | 8/2001 | Capodieci |
| 6,275,604 B1 | 8/2001 | Miyajima et al. |
| 6,275,971 B1 | 8/2001 | Levy et al. |
| 6,282,693 B1 | 8/2001 | Naylor et al. |
| 6,282,694 B1 | 8/2001 | Cheng et al. |
| 6,282,696 B1 | 8/2001 | Garza et al. |
| 6,286,126 B1 | 9/2001 | Raghavan et al. |
| 6,286,128 B1 | 9/2001 | Pileggi et al. |
| 6,292,929 B2 | 9/2001 | Scepanovic et al. |
| 6,301,686 B1 | 10/2001 | Kikuchi et al. |
| 6,301,692 B1 | 10/2001 | Kumashiro et al. |
| 6,301,693 B1 | 10/2001 | Naylor et al. |
| 6,308,143 B1 | 10/2001 | Segawa |
| 6,311,315 B1 | 10/2001 | Tamaki |
| 6,317,866 B1 | 11/2001 | Tamura |
| 6,321,366 B1 | 11/2001 | Tsang et al. |
| 6,324,673 B1 | 11/2001 | Luo et al. |
| 6,335,930 B1 | 1/2002 | Lee |
| 6,336,205 B1 | 1/2002 | Kurokawa et al. |
| 6,339,836 B1 | 1/2002 | Eisenhofer et al. |
| 6,340,543 B1 | 1/2002 | Nagamura et al. |
| 6,343,370 B1 | 1/2002 | Taoka et al. |
| 6,345,210 B1 | 2/2002 | Yu |
| 6,349,401 B2 | 2/2002 | Tamaki |
| 6,351,841 B1 | 2/2002 | Tickle |
| 6,357,036 B1 | 3/2002 | Eka et al. |
| 6,360,356 B1 | 3/2002 | Eng |
| 6,370,673 B1 | 4/2002 | Hill |
| 6,378,114 B1 | 4/2002 | Shenoy et al. |
| 6,381,731 B1 | 4/2002 | Grodd |
| 6,385,758 B1 | 5/2002 | Kikuchi et al. |
| 6,388,736 B1 | 5/2002 | Smith et al. |
| 6,393,604 B1 | 5/2002 | Yamada et al. |
| 6,418,553 B1 | 7/2002 | Yamada et al. |
| 6,425,112 B1 | 7/2002 | Bula et al. |
| 6,425,117 B1 | 7/2002 | Pasch et al. |
| 6,427,225 B1 | 7/2002 | Kitada et al. |
| 6,436,590 B2 | 8/2002 | Wang et al. |
| 6,442,743 B1 | 8/2002 | Sarrafzadeh et al. |
| 6,446,239 B1 | 9/2002 | Markosian et al. |
| 6,449,761 B1 | 9/2002 | Greidinger et al. |
| 6,457,158 B1 | 9/2002 | Inoue |
| 6,465,138 B1 | 10/2002 | Stanton |
| 6,469,540 B2 | 10/2002 | Nakaya |
| 6,470,489 B1 | 10/2002 | Chang et al. |
| 6,472,107 B1 | 10/2002 | Chan |
| 6,473,882 B2 | 10/2002 | Mukai |
| 6,480,995 B1 | 11/2002 | Schmidt et al. |
| 6,496,435 B2 | 12/2002 | Kato |
| 6,505,333 B1 | 1/2003 | Tanaka |
| 6,507,931 B2 | 1/2003 | Kotani et al. |
| 6,516,450 B1 | 2/2003 | Hill et al. |
| 6,516,458 B1 | 2/2003 | Fukui |
| 6,519,751 B2 * | 2/2003 | Sriram .............. G06F 17/5077 716/129 |
| 6,524,752 B1 | 2/2003 | Pierrat |
| 6,526,555 B1 | 2/2003 | Teig et al. |
| 6,536,012 B1 | 3/2003 | Mizuno |
| 6,536,023 B1 | 3/2003 | Mohan et al. |
| 6,539,533 B1 | 3/2003 | Brown, III et al. |
| 6,543,042 B2 | 4/2003 | Kato |
| 6,546,540 B1 | 4/2003 | Igarashi et al. |
| 6,548,417 B2 | 4/2003 | Dao et al. |
| 6,550,017 B1 | 4/2003 | Becker |
| 6,553,338 B1 | 4/2003 | Buch et al. |
| 6,553,554 B1 | 4/2003 | Dahl et al. |
| 6,553,560 B2 | 4/2003 | Ma et al. |
| 6,553,562 B2 * | 4/2003 | Capodieci .......... G03F 7/70425 430/311 |
| 6,557,153 B1 | 4/2003 | Dahl et al. |
| 6,563,566 B2 * | 5/2003 | Rosenbluth ............. G03F 1/32 250/492.2 |
| 6,564,363 B1 | 5/2003 | Dahl et al. |
| 6,564,364 B1 | 5/2003 | Dahl et al. |
| 6,569,583 B2 | 5/2003 | Cho et al. |
| 6,574,779 B2 | 6/2003 | Allen et al. |
| 6,576,147 B2 | 6/2003 | Mukai |
| 6,577,994 B1 | 6/2003 | Tsukuda |
| 6,578,179 B2 | 6/2003 | Shirotori et al. |
| 6,578,190 B2 | 6/2003 | Ferguson et al. |
| 6,584,599 B2 | 6/2003 | Fujii |
| 6,584,610 B1 | 6/2003 | Wu et al. |
| 6,587,992 B2 | 7/2003 | Marple |
| 6,594,811 B2 | 7/2003 | Katz |
| 6,608,920 B1 | 8/2003 | Su et al. |
| 6,625,800 B1 | 9/2003 | Qian et al. |

(56) References Cited

U.S. PATENT DOCUMENTS

| | | |
|---|---|---|
| 6,643,616 B1 | 11/2003 | Granik et al. |
| 6,651,235 B2 | 11/2003 | Dai et al. |
| 6,658,640 B2 | 12/2003 | Weed |
| 6,662,348 B1 | 12/2003 | Naylor et al. |
| 6,665,854 B2 | 12/2003 | Fujiwara et al. |
| 6,665,856 B1 | 12/2003 | Pierrat et al. |
| 6,668,366 B2 | 12/2003 | Liao et al. |
| 6,670,080 B2 | 12/2003 | Sugita et al. |
| 6,671,859 B1 | 12/2003 | Naylor et al. |
| 6,671,867 B2 | 12/2003 | Alpert et al. |
| 6,674,678 B2 | 1/2004 | Kato |
| 6,691,297 B1 | 2/2004 | Misaka et al. |
| 6,701,289 B1 | 3/2004 | Garnett et al. |
| 6,709,901 B1 | 3/2004 | Yamazaki et al. |
| 6,727,565 B2 | 4/2004 | Itoh |
| 6,728,943 B2 | 4/2004 | Kanamoto |
| 6,732,345 B2 * | 5/2004 | Kato ............... G06F 17/5077 716/122 |
| 6,733,929 B2 * | 5/2004 | Pierrat ............... G03F 1/30 430/30 |
| 6,735,742 B2 | 5/2004 | Hatsch et al. |
| 6,735,749 B2 | 5/2004 | Li et al. |
| 6,745,372 B2 | 6/2004 | Cote et al. |
| 6,749,971 B2 * | 6/2004 | Lukanc ............... G03F 1/30 430/5 |
| 6,751,519 B1 | 6/2004 | Satya et al. |
| 6,756,242 B1 | 6/2004 | Regan |
| 6,757,878 B2 | 6/2004 | Srinivasan et al. |
| 6,757,886 B2 | 6/2004 | Liebmann et al. |
| 6,759,698 B2 | 7/2004 | Tanaka |
| 6,763,508 B2 | 7/2004 | Igarashi et al. |
| 6,766,500 B1 | 7/2004 | Donelly et al. |
| 6,774,899 B1 | 8/2004 | Ryall et al. |
| 6,777,147 B1 | 8/2004 | Fonseca et al. |
| 6,779,167 B2 * | 8/2004 | Igarashi ............... G06F 17/5077 257/774 |
| 6,785,879 B2 | 8/2004 | Pierrat |
| 6,787,271 B2 | 9/2004 | Cote et al. |
| 6,787,459 B2 | 9/2004 | Moniwa et al. |
| 6,789,246 B1 | 9/2004 | Mohan et al. |
| 6,791,128 B1 | 9/2004 | Yamauchi |
| 6,792,586 B2 | 9/2004 | Li |
| 6,794,677 B2 | 9/2004 | Tamaki et al. |
| 6,802,050 B2 | 10/2004 | Shen et al. |
| 6,804,808 B2 | 10/2004 | Li et al. |
| 6,806,499 B2 | 10/2004 | Yamazaki et al. |
| 6,811,935 B2 | 11/2004 | Pierrat |
| 6,813,756 B2 | 11/2004 | Igarashi et al. |
| 6,816,998 B2 | 11/2004 | Li |
| 6,829,380 B1 | 12/2004 | Choo et al. |
| 6,832,360 B2 | 12/2004 | Li |
| 6,832,364 B2 | 12/2004 | Heng et al. |
| 6,834,380 B2 * | 12/2004 | Khazei ............... G06F 17/5036 703/13 |
| 6,839,470 B2 | 1/2005 | Ikeda |
| 6,846,596 B2 | 1/2005 | Wu |
| 6,852,471 B2 | 2/2005 | Pierrat et al. |
| 6,861,183 B2 | 3/2005 | Barber |
| 6,862,726 B2 | 3/2005 | Futatsuya et al. |
| 6,866,971 B2 | 3/2005 | Pierrat |
| 6,871,332 B2 | 3/2005 | Li et al. |
| 6,871,338 B2 | 3/2005 | Yamauchi |
| 6,874,133 B2 | 3/2005 | Gopalakrishnan et al. |
| 6,877,145 B2 | 4/2005 | Boylan et al. |
| 6,880,134 B2 | 4/2005 | Drennan |
| 6,882,012 B2 | 4/2005 | Yamazaki et al. |
| 6,883,149 B2 | 4/2005 | Li et al. |
| 6,883,153 B2 | 4/2005 | Jiang et al. |
| 6,892,363 B2 | 5/2005 | Li |
| 6,892,368 B2 | 5/2005 | Li et al. |
| 6,901,576 B2 | 5/2005 | Liebmann et al. |
| 6,904,571 B1 | 6/2005 | Schmidt et al. |
| 6,909,330 B2 | 6/2005 | Colleran et al. |
| 6,912,704 B1 | 6/2005 | Teig |
| 6,925,202 B2 * | 8/2005 | Karklin ............... G01N 21/95607 348/126 |
| 6,928,015 B2 | 8/2005 | Ooishi |
| 6,928,634 B2 * | 8/2005 | Granik ............... G03F 7/70433 716/52 |
| 6,931,613 B2 | 8/2005 | Kauth et al. |
| 6,938,231 B2 | 8/2005 | Yoshida et al. |
| 6,948,145 B2 | 9/2005 | Brown, III et al. |
| 6,954,911 B2 | 10/2005 | Pierrat |
| 6,954,921 B2 | 10/2005 | Hassibi et al. |
| 6,957,400 B2 | 10/2005 | Liu et al. |
| 6,957,402 B2 * | 10/2005 | Templeton ............... G06F 17/5045 716/104 |
| 6,957,411 B1 | 10/2005 | Teig et al. |
| 6,961,545 B2 | 11/2005 | Tehrani et al. |
| 6,961,916 B2 | 11/2005 | Sarrafzadeh et al. |
| 6,961,920 B2 * | 11/2005 | Zach ............... G03F 1/36 430/30 |
| 6,970,759 B2 * | 11/2005 | Desplats ............... G06F 17/5068 700/109 |
| 6,971,080 B2 | 11/2005 | Grodd |
| 6,978,438 B1 | 12/2005 | Capodieci |
| 6,983,440 B1 | 1/2006 | Nequist |
| 6,986,109 B2 * | 1/2006 | Allen ............... G06F 17/5068 716/122 |
| 6,989,687 B2 | 1/2006 | Or-Bach |
| 6,992,290 B2 | 1/2006 | Watanabe et al. |
| 6,993,741 B2 | 1/2006 | Liebmann et al. |
| 6,996,790 B2 * | 2/2006 | Chang ............... G06F 17/5068 382/145 |
| 7,003,758 B2 | 2/2006 | Ye et al. |
| 7,007,258 B2 | 2/2006 | Li |
| 7,010,770 B2 * | 3/2006 | Liang ............... G06F 17/5081 716/112 |
| 7,013,439 B2 | 3/2006 | Robles et al. |
| 7,013,445 B1 | 3/2006 | Teig et al. |
| 7,018,788 B2 | 3/2006 | Lin |
| 7,024,655 B2 | 4/2006 | Cobb |
| 7,028,272 B2 * | 4/2006 | Mandal ............... G06F 17/5068 716/119 |
| 7,028,285 B2 | 4/2006 | Cote et al. |
| 7,036,103 B2 | 4/2006 | Miller et al. |
| 7,039,881 B2 | 5/2006 | Regan |
| 7,043,071 B2 | 5/2006 | Qian et al. |
| 7,058,913 B1 | 6/2006 | Siegel et al. |
| 7,065,727 B2 | 6/2006 | Hershenson et al. |
| 7,065,729 B1 | 6/2006 | Chapman |
| 7,069,534 B2 | 6/2006 | Sahouria et al. |
| 7,073,144 B2 | 7/2006 | Alpert et al. |
| 7,076,746 B2 | 7/2006 | Hamlin et al. |
| 7,080,349 B1 | 7/2006 | Babcock et al. |
| 7,083,879 B2 | 8/2006 | Pierrat et al. |
| 7,089,519 B1 | 8/2006 | Telg |
| 7,093,205 B2 | 8/2006 | Heydler et al. |
| 7,096,449 B1 | 8/2006 | Teig et al. |
| 7,098,530 B2 | 8/2006 | Jansman et al. |
| 7,100,129 B1 | 8/2006 | Salowe et al. |
| 7,100,134 B2 | 8/2006 | Wu et al. |
| 7,103,864 B2 | 9/2006 | Isobe |
| 7,103,870 B2 | 9/2006 | Misaka et al. |
| 7,109,730 B2 | 9/2006 | Slupsky |
| 7,111,276 B2 | 9/2006 | Kamat et al. |
| 7,115,343 B2 | 10/2006 | Gordon et al. |
| 7,117,456 B2 | 10/2006 | Gray et al. |
| 7,117,468 B2 | 10/2006 | Teig et al. |
| 7,120,887 B2 | 10/2006 | Bonges, III et al. |
| 7,124,385 B2 | 10/2006 | McGuinness et al. |
| 7,124,386 B2 | 10/2006 | Smith et al. |
| 7,128,270 B2 | 10/2006 | Silverbrook et al. |
| 7,132,203 B2 | 11/2006 | Pierrat |
| 7,134,102 B2 | 11/2006 | Poechmueller |
| 7,134,111 B2 | 11/2006 | Nakamoto |
| 7,147,976 B2 | 12/2006 | Liebmann et al. |
| 7,175,942 B2 | 2/2007 | Liebmann et al. |
| 7,178,128 B2 | 2/2007 | Liu et al. |
| 7,181,707 B2 * | 2/2007 | Kotani ............... H01L 22/20 257/E21.525 |
| 7,184,015 B2 | 2/2007 | Morita |

(56) References Cited

U.S. PATENT DOCUMENTS

| | | | |
|---|---|---|---|
| 7,187,796 B1 | 3/2007 | Phan et al. | |
| 7,188,322 B2 | 3/2007 | Cohn et al. | |
| 7,194,725 B1 * | 3/2007 | Lukanc | G06F 17/5081 716/52 |
| 7,197,738 B1 * | 3/2007 | Hetzel | G06F 17/5077 716/126 |
| 7,200,827 B1 | 4/2007 | Ku et al. | |
| 7,200,835 B2 | 4/2007 | Zhang et al. | |
| 7,205,191 B2 | 4/2007 | Kobayashi | |
| 7,216,320 B2 | 5/2007 | Chang et al. | |
| 7,225,422 B2 | 5/2007 | Bucki et al. | |
| 7,225,423 B2 * | 5/2007 | Bhattacharya | G06F 17/5045 716/102 |
| 7,228,523 B2 | 6/2007 | Kobayashi | |
| 7,242,591 B2 | 7/2007 | Imamura et al. | |
| 7,246,342 B2 | 7/2007 | Hsu et al. | |
| 7,257,783 B2 | 8/2007 | Allen et al. | |
| 7,266,800 B2 | 9/2007 | Sezginer | |
| 7,266,801 B2 | 9/2007 | Kotani et al. | |
| 7,269,803 B2 | 9/2007 | Khakzadi et al. | |
| 7,269,804 B2 * | 9/2007 | Tabery | G03F 7/70433 430/5 |
| 7,269,809 B2 | 9/2007 | Shastri et al. | |
| 7,276,714 B2 | 10/2007 | Platzgummer et al. | |
| 7,284,231 B2 | 10/2007 | Lucas et al. | |
| 7,294,056 B2 | 11/2007 | Lowell et al. | |
| 7,296,252 B2 | 11/2007 | Alpert et al. | |
| 7,299,459 B1 | 11/2007 | Boyd et al. | |
| 7,302,651 B2 | 11/2007 | Allen et al. | |
| 7,303,842 B2 * | 12/2007 | Watson | G03F 1/72 430/30 |
| 7,304,544 B2 | 12/2007 | Colleran et al. | |
| 7,308,660 B2 | 12/2007 | Nozuyama | |
| 7,310,786 B2 | 12/2007 | Yang et al. | |
| 7,313,014 B2 | 12/2007 | Ooishi | |
| 7,313,508 B2 | 12/2007 | Crottie et al. | |
| 7,313,769 B1 * | 12/2007 | Lukanc | G06F 17/5081 716/52 |
| 7,315,994 B2 | 1/2008 | Aller et al. | |
| 7,325,206 B2 * | 1/2008 | White | G06F 17/5068 257/E21.244 |
| 7,337,379 B2 | 2/2008 | Hiraide | |
| 7,337,426 B2 | 2/2008 | Kotani et al. | |
| 7,345,888 B2 | 3/2008 | Imamura et al. | |
| 7,346,865 B2 | 3/2008 | Su et al. | |
| 7,350,174 B2 | 3/2008 | Srinivasan et al. | |
| 7,351,969 B2 | 4/2008 | Watanabe et al. | |
| 7,356,795 B2 | 4/2008 | Yamauchi | |
| 7,360,191 B2 | 4/2008 | Chang et al. | |
| 7,363,601 B2 | 4/2008 | Heng et al. | |
| 7,368,738 B2 | 5/2008 | Platzgummer | |
| 7,370,303 B2 | 5/2008 | Einspenner et al. | |
| 7,370,403 B1 | 5/2008 | Hsu et al. | |
| 7,380,227 B1 | 5/2008 | Li | |
| 7,383,521 B2 * | 6/2008 | Smith | G06F 17/5068 716/114 |
| 7,383,527 B2 | 6/2008 | Enomoto et al. | |
| 7,385,988 B2 | 6/2008 | Asati | |
| 7,401,312 B2 | 7/2008 | Krauch et al. | |
| 7,404,165 B2 | 7/2008 | Misaka et al. | |
| 7,404,168 B2 | 7/2008 | Miller et al. | |
| 7,421,676 B2 | 9/2008 | Tan et al. | |
| 7,437,691 B2 | 10/2008 | Tang et al. | |
| 7,440,449 B2 | 10/2008 | Carson et al. | |
| 7,446,352 B2 | 11/2008 | Becker et al. | |
| 7,448,012 B1 | 11/2008 | Qian | |
| 7,454,721 B2 | 11/2008 | Hibbeler et al. | |
| 7,464,356 B2 | 12/2008 | Alpert et al. | |
| 7,467,369 B2 | 12/2008 | Alpert et al. | |
| 7,470,489 B2 | 12/2008 | Liebmann et al. | |
| 7,484,197 B2 | 1/2009 | Allen et al. | |
| 7,484,199 B2 | 1/2009 | Alpert et al. | |
| 7,493,581 B2 | 2/2009 | Siegel et al. | |
| 7,506,295 B1 | 3/2009 | Teig | |
| 7,512,927 B2 | 3/2009 | Gallatin et al. | |
| 7,515,186 B2 | 4/2009 | Moini et al. | |
| 7,516,433 B1 | 4/2009 | Pucci et al. | |
| 7,523,429 B2 * | 4/2009 | Kroyan | G06F 17/5068 716/119 |
| 7,530,038 B2 | 5/2009 | Gristede et al. | |
| 7,533,359 B2 | 5/2009 | Scheffer et al. | |
| 7,543,252 B2 | 6/2009 | McCullen | |
| 7,549,137 B2 | 6/2009 | Alpert et al. | |
| 7,567,279 B2 | 7/2009 | Yourlo et al. | |
| 7,569,838 B2 | 8/2009 | Watanabe et al. | |
| 7,577,049 B1 | 8/2009 | Kornachuk | |
| 7,579,214 B2 | 8/2009 | Yamazaki et al. | |
| 7,581,197 B2 | 8/2009 | Arunachalam | |
| 7,586,800 B1 | 9/2009 | Kornachuk | |
| 7,587,696 B2 | 9/2009 | Nakamoto | |
| 7,588,868 B2 | 9/2009 | Zach et al. | |
| 7,590,968 B1 | 9/2009 | Becker et al. | |
| 7,596,420 B2 | 9/2009 | Kiers et al. | |
| 7,605,940 B2 | 10/2009 | Silverbrook et al. | |
| 7,610,565 B2 | 10/2009 | Allen et al. | |
| 7,624,364 B2 | 11/2009 | Albrecht et al. | |
| 7,624,366 B2 | 11/2009 | Alpert et al. | |
| 7,653,884 B2 | 1/2010 | Furnish et al. | |
| 7,669,160 B2 | 2/2010 | Furnish et al. | |
| 7,669,161 B2 | 2/2010 | Lin | |
| 7,669,170 B2 | 2/2010 | Cohn et al. | |
| 7,673,260 B2 | 3/2010 | Chen et al. | |
| 7,695,871 B2 | 4/2010 | van Adrichem | |
| 7,698,665 B2 | 4/2010 | Abrams et al. | |
| 7,698,676 B1 | 4/2010 | Qian | |
| 7,703,059 B2 | 4/2010 | Murray et al. | |
| 7,712,064 B2 | 5/2010 | Scheffer et al. | |
| 7,712,068 B2 | 5/2010 | Ren et al. | |
| 7,716,614 B2 | 5/2010 | Kauth et al. | |
| 7,716,624 B2 | 5/2010 | Sahouria et al. | |
| 7,721,235 B1 | 5/2010 | Nequist et al. | |
| 7,735,042 B2 | 6/2010 | Gray et al. | |
| 7,739,642 B2 | 6/2010 | Albrecht | |
| 7,743,354 B2 | 6/2010 | Albrecht et al. | |
| 7,752,588 B2 | 7/2010 | Bose | |
| 7,760,259 B2 | 7/2010 | Moini et al. | |
| 7,761,818 B2 | 7/2010 | Gray et al. | |
| 7,761,821 B2 | 7/2010 | Allen et al. | |
| 7,763,534 B2 | 7/2010 | Smayling et al. | |
| 7,765,498 B1 | 7/2010 | Ho et al. | |
| 7,774,732 B2 | 8/2010 | KleinOsowski et al. | |
| 7,784,015 B2 | 8/2010 | Pitts | |
| 7,788,627 B2 | 8/2010 | Abrams et al. | |
| 7,793,253 B2 | 9/2010 | Abrams et al. | |
| 7,814,447 B2 | 10/2010 | Scheffer et al. | |
| 7,814,451 B2 | 10/2010 | Furnish et al. | |
| 7,842,975 B2 | 11/2010 | Becker et al. | |
| 7,853,915 B2 | 12/2010 | Saxena et al. | |
| 7,879,538 B2 | 2/2011 | Wang | |
| 7,882,463 B2 | 2/2011 | Heng et al. | |
| 7,888,705 B2 | 2/2011 | Becker et al. | |
| 7,895,562 B2 | 2/2011 | Gray et al. | |
| 7,904,862 B2 | 3/2011 | Nequist | |
| 7,906,801 B2 | 3/2011 | Becker et al. | |
| 7,908,573 B2 | 3/2011 | Lin | |
| 7,908,578 B2 | 3/2011 | Becker et al. | |
| 7,910,958 B2 | 3/2011 | Becker et al. | |
| 7,910,959 B2 | 3/2011 | Becker et al. | |
| 7,913,210 B2 | 3/2011 | Albrecht et al. | |
| 7,917,879 B2 | 3/2011 | Becker et al. | |
| 7,917,885 B2 | 3/2011 | Becker | |
| RE42,294 E | 4/2011 | Kotani et al. | |
| RE42,302 E | 4/2011 | Kotani et al. | |
| 7,921,392 B2 | 4/2011 | Furnish et al. | |
| 7,921,393 B2 | 4/2011 | Furnish et al. | |
| 7,923,757 B2 | 4/2011 | Becker et al. | |
| 7,924,042 B2 | 4/2011 | Isobe | |
| 7,932,544 B2 | 4/2011 | Becker et al. | |
| 7,932,545 B2 | 4/2011 | Becker et al. | |
| 7,934,188 B2 | 4/2011 | Alpert et al. | |
| 7,937,682 B2 | 5/2011 | Arunachalam et al. | |
| 7,939,443 B2 | 5/2011 | Fox et al. | |
| 7,941,768 B1 | 5/2011 | Wei | |

(56) References Cited

U.S. PATENT DOCUMENTS

| | | |
|---|---|---|
| 7,943,966 B2 | 5/2011 | Becker et al. |
| 7,943,967 B2 | 5/2011 | Becker et al. |
| 7,948,012 B2 | 5/2011 | Becker et al. |
| 7,948,013 B2 | 5/2011 | Becker et al. |
| 7,952,119 B2 | 5/2011 | Becker et al. |
| 7,943,436 B2 | 6/2011 | McElvain |
| 7,956,421 B2 | 6/2011 | Becker |
| 7,962,879 B2 | 6/2011 | Tang et al. |
| 7,979,829 B2 | 7/2011 | Smayling |
| 7,984,410 B2 | 7/2011 | Chen et al. |
| 7,989,847 B2 | 8/2011 | Becker et al. |
| 7,989,848 B2 | 8/2011 | Becker et al. |
| 7,990,450 B2 | 8/2011 | Silverbrook et al. |
| 7,992,122 B1 | 8/2011 | Burstein et al. |
| 7,994,545 B2 | 8/2011 | Smayling et al. |
| 7,995,183 B2 | 8/2011 | Yamazaki et al. |
| 8,022,441 B2 | 9/2011 | Becker et al. |
| 8,023,020 B2 | 9/2011 | Moini et al. |
| 8,028,252 B2 | 9/2011 | Cecil |
| 8,030,689 B2 | 10/2011 | Becker et al. |
| 8,035,133 B2 | 10/2011 | Becker et al. |
| 8,037,441 B2 | 10/2011 | Ringe et al. |
| 8,058,671 B2 | 11/2011 | Becker et al. |
| 8,058,691 B2 | 11/2011 | Becker |
| 8,069,429 B2 | 11/2011 | Miller et al. |
| 8,072,003 B2 | 12/2011 | Becker et al. |
| 8,088,679 B2 | 1/2012 | Becker et al. |
| 8,088,680 B2 | 1/2012 | Becker et al. |
| 8,088,681 B2 | 1/2012 | Becker et al. |
| 8,088,682 B2 | 1/2012 | Becker et al. |
| 8,089,098 B2 | 1/2012 | Becker et al. |
| 8,089,099 B2 | 1/2012 | Becker et al. |
| 8,089,100 B2 | 1/2012 | Becker et al. |
| 8,089,101 B2 | 1/2012 | Becker et al. |
| 8,089,102 B2 | 1/2012 | Becker et al. |
| 8,089,103 B2 | 1/2012 | Becker et al. |
| 8,089,104 B2 | 1/2012 | Becker et al. |
| 8,091,059 B2 | 1/2012 | Alpert et al. |
| 8,095,894 B2 | 1/2012 | Misaka et al. |
| 8,099,693 B2 | 1/2012 | Pedenon et al. |
| 8,099,702 B2 | 1/2012 | Hou et al. |
| 8,101,975 B2 | 1/2012 | Becker et al. |
| 8,103,983 B2 | 1/2012 | Agarwal et al. |
| 8,108,819 B2 | 1/2012 | Alpert et al. |
| 8,110,854 B2 | 2/2012 | Becker et al. |
| 8,112,732 B2 | 2/2012 | Alpert et al. |
| 8,129,750 B2 | 3/2012 | Becker et al. |
| 8,129,751 B2 | 3/2012 | Becker et al. |
| 8,129,752 B2 | 3/2012 | Becker et al. |
| 8,129,753 B2 | 3/2012 | Becker et al. |
| 8,129,754 B2 | 3/2012 | Becker et al. |
| 8,129,755 B2 | 3/2012 | Becker et al. |
| 8,129,756 B2 | 3/2012 | Becker et al. |
| 8,129,757 B2 | 3/2012 | Becker et al. |
| 8,129,819 B2 | 3/2012 | Becker et al. |
| 8,131,943 B2 | 3/2012 | Colglazier et al. |
| 8,134,183 B2 | 3/2012 | Becker et al. |
| 8,134,184 B2 | 3/2012 | Becker et al. |
| 8,134,185 B2 | 3/2012 | Becker et al. |
| 8,134,186 B2 | 3/2012 | Becker et al. |
| 8,136,168 B2 | 3/2012 | Cheng et al. |
| 8,138,525 B2 | 3/2012 | Becker et al. |
| 8,163,190 B2 | 4/2012 | Moon |
| 8,176,445 B1 | 5/2012 | Qian |
| 8,198,656 B2 | 6/2012 | Becker et al. |
| 8,207,053 B2 | 6/2012 | Becker et al. |
| 8,214,778 B2 | 7/2012 | Quandt et al. |
| 8,217,428 B2 | 7/2012 | Becker et al. |
| 8,225,239 B2 | 7/2012 | Reed et al. |
| 8,225,248 B2 | 7/2012 | Chen et al. |
| 8,225,261 B2 | 7/2012 | Hong et al. |
| 8,234,612 B2 | 7/2012 | Goodman et al. |
| 8,239,792 B2 | 8/2012 | Arunachalam |
| 8,245,171 B2 | 8/2012 | Lepere et al. |
| 8,245,180 B2 | 8/2012 | Smayling et al. |
| 8,247,846 B2 | 8/2012 | Becker |
| 8,253,172 B2 | 8/2012 | Becker et al. |
| 8,253,173 B2 | 8/2012 | Becker et al. |
| RE43,659 E | 9/2012 | Kotani et al. |
| 8,258,547 B2 | 9/2012 | Becker et al. |
| 8,258,548 B2 | 9/2012 | Becker et al. |
| 8,258,549 B2 | 9/2012 | Becker et al. |
| 8,258,550 B2 | 9/2012 | Becker et al. |
| 8,258,551 B2 | 9/2012 | Becker et al. |
| 8,258,552 B2 | 9/2012 | Becker et al. |
| 8,258,581 B2 | 9/2012 | Becker |
| 8,261,217 B2 | 9/2012 | Kobayashi |
| 8,261,223 B2 | 9/2012 | Hsu et al. |
| 8,264,007 B2 | 9/2012 | Becker et al. |
| 8,264,008 B2 | 9/2012 | Becker et al. |
| 8,264,009 B2 | 9/2012 | Becker et al. |
| 8,264,044 B2 | 9/2012 | Becker |
| 8,264,049 B2 | 9/2012 | Becker |
| 8,266,557 B1 | 9/2012 | Qian |
| 8,266,566 B2 | 9/2012 | Hopkins et al. |
| 8,266,570 B2 | 9/2012 | Walker et al. |
| 8,271,920 B2 | 9/2012 | Cho et al. |
| 8,274,099 B2 | 9/2012 | Becker |
| 8,283,701 B2 | 10/2012 | Becker et al. |
| 8,286,107 B2 | 10/2012 | Smayling et al. |
| 8,296,706 B2 | 10/2012 | Gray et al. |
| 8,302,062 B2 | 10/2012 | Gray et al. |
| 8,307,316 B2 | 11/2012 | Albrecht et al. |
| 8,316,335 B2 | 11/2012 | Barowski et al. |
| 8,332,793 B2 | 12/2012 | Bose |
| 8,347,257 B2 | 1/2013 | Alpert et al. |
| 8,352,887 B2 | 1/2013 | Dal et al. |
| 8,356,268 B2 | 1/2013 | Becker et al. |
| 8,359,556 B1 | 1/2013 | Abou Ghaida et al. |
| 8,365,107 B2 | 1/2013 | Tyminski et al. |
| 8,365,120 B2 | 1/2013 | Alpert et al. |
| 8,370,782 B2 | 2/2013 | Alpert et al. |
| 8,395,224 B2 | 3/2013 | Becker et al. |
| 8,405,162 B2 | 3/2013 | Becker et al. |
| 8,405,163 B2 | 3/2013 | Becker et al. |
| 8,418,108 B2 | 4/2013 | Alpert et al. |
| 8,423,940 B2 | 4/2013 | Daellenbach et al. |
| 8,423,941 B2 | 4/2013 | Heng et al. |
| 8,434,035 B2 | 4/2013 | Arunachalam |
| 8,436,400 B2 | 5/2013 | Becker et al. |
| 8,448,097 B2 | 5/2013 | Dai et al. |
| 8,448,102 B2 | 5/2013 | Kornachuk et al. |
| 8,453,093 B2 | 5/2013 | Kim et al. |
| 8,453,094 B2 | 5/2013 | Kornachuk et al. |
| 8,453,103 B2 | 5/2013 | Bendicksen et al. |
| 8,464,187 B1 | 6/2013 | Qian |
| 8,464,189 B2 | 6/2013 | Allen et al. |
| 8,471,391 B2 | 6/2013 | Fox et al. |
| 8,473,874 B1 | 6/2013 | Sharma et al. |
| 8,473,881 B1 | 6/2013 | Fang et al. |
| 8,490,034 B1 | 7/2013 | Torunoglu et al. |
| 8,495,534 B2 | 7/2013 | Alpert et al. |
| 8,495,548 B2 | 7/2013 | Agarwal et al. |
| 8,510,690 B2 | 8/2013 | Kauth et al. |
| 8,527,927 B2 | 9/2013 | Walker et al. |
| 8,533,650 B2 | 9/2013 | Arsintescu et al. |
| 8,541,879 B2 | 9/2013 | Smayling |
| 8,549,448 B2 | 10/2013 | Vuillod et al. |
| 8,549,455 B2 | 10/2013 | Quandt et al. |
| 8,552,508 B2 | 10/2013 | Becker et al. |
| 8,552,509 B2 | 10/2013 | Becker et al. |
| 8,558,322 B2 | 10/2013 | Becker et al. |
| 8,564,071 B2 | 10/2013 | Becker et al. |
| 8,569,841 B2 | 10/2013 | Becker et al. |
| 8,575,706 B2 | 11/2013 | Becker et al. |
| 8,581,303 B2 | 11/2013 | Becker et al. |
| 8,581,304 B2 | 11/2013 | Becker et al. |
| 8,587,034 B2 | 11/2013 | Becker et al. |
| 8,589,845 B2 | 11/2013 | Albrecht et al. |
| 8,592,872 B2 | 11/2013 | Becker et al. |
| 8,631,361 B2 | 1/2014 | Feng |
| 8,653,857 B2 | 2/2014 | Becker |
| 8,658,542 B2 | 2/2014 | Smayling et al. |
| 8,661,375 B2 | 2/2014 | Wang |

(56) References Cited

U.S. PATENT DOCUMENTS

| | | |
|---|---|---|
| 8,661,391 B1 | 2/2014 | Viswanath et al. |
| 8,661,392 B2 | 2/2014 | Quandt et al. |
| 8,667,441 B2 | 3/2014 | Alpert et al. |
| 8,667,443 B2 | 3/2014 | Smayling et al. |
| 8,669,594 B2 | 3/2014 | Becker et al. |
| 8,669,595 B2 | 3/2014 | Becker et al. |
| 8,677,297 B2 | 3/2014 | Chase et al. |
| 8,680,583 B2 | 3/2014 | Becker et al. |
| 8,680,626 B2 | 3/2014 | Smayling et al. |
| 8,701,071 B2 | 4/2014 | Kornachuk et al. |
| 8,726,215 B2 | 5/2014 | Lee et al. |
| 8,729,606 B2 | 5/2014 | Becker et al. |
| 8,729,643 B2 | 5/2014 | Becker et al. |
| 8,735,944 B2 | 5/2014 | Becker et al. |
| 8,735,995 B2 | 5/2014 | Becker et al. |
| 8,742,462 B2 | 6/2014 | Becker et al. |
| 8,742,463 B2 | 6/2014 | Becker et al. |
| 8,751,986 B2 | 6/2014 | Arunachalam et al. |
| 8,756,551 B2 | 6/2014 | Becker et al. |
| 8,759,882 B2 | 6/2014 | Becker et al. |
| 8,759,985 B2 | 6/2014 | Fox et al. |
| 8,772,839 B2 | 7/2014 | Becker et al. |
| 8,775,977 B2 | 7/2014 | Hsu et al. |
| 8,782,585 B2 | 7/2014 | Guthaus |
| 8,785,978 B2 | 7/2014 | Becker et al. |
| 8,785,979 B2 | 7/2014 | Becker et al. |
| 8,793,636 B2 | 7/2014 | Alpert et al. |
| 8,816,402 B2 | 8/2014 | Becker et al. |
| 8,823,062 B2 | 9/2014 | Becker et al. |
| 8,835,989 B2 | 9/2014 | Becker et al. |
| 8,836,045 B2 | 9/2014 | Becker et al. |
| 8,839,175 B2 | 9/2014 | Smayling et al. |
| 8,843,867 B2 | 9/2014 | Chase et al. |
| 8,847,329 B2 | 9/2014 | Becker et al. |
| 8,847,331 B2 | 9/2014 | Becker et al. |
| 8,853,793 B2 | 10/2014 | Becker et al. |
| 8,853,794 B2 | 10/2014 | Becker et al. |
| 8,863,051 B2 | 10/2014 | Kauth et al. |
| 8,863,063 B2 | 10/2014 | Becker et al. |
| 8,866,197 B2 | 10/2014 | Becker et al. |
| 8,872,283 B2 | 10/2014 | Becker et al. |
| 8,875,082 B1 | 10/2014 | Sircar et al. |
| 8,881,089 B1 | 11/2014 | Alpert et al. |
| 8,893,061 B2 | 11/2014 | Rieger et al. |
| 8,921,896 B2 | 12/2014 | Becker et al. |
| 8,921,897 B2 | 12/2014 | Becker et al. |
| 8,934,066 B2 | 1/2015 | Yamazaki et al. |
| 8,935,643 B2 | 1/2015 | Salem et al. |
| 8,938,696 B1 | 1/2015 | Torunoglu et al. |
| 8,946,781 B2 | 2/2015 | Becker et al. |
| 8,949,755 B2 | 2/2015 | Helvey |
| 8,951,916 B2 | 2/2015 | Smayling |
| 8,952,425 B2 | 2/2015 | Becker et al. |
| 8,954,912 B2 | 2/2015 | Alpert et al. |
| 8,966,424 B2 | 2/2015 | Quandt et al. |
| 8,966,427 B2 | 2/2015 | Guthaus et al. |
| 8,984,464 B1 | 3/2015 | Mihal et al. |
| 8,984,467 B2 | 3/2015 | Arunachalam |
| 9,009,641 B2 | 4/2015 | Becker et al. |
| 9,035,359 B2 | 5/2015 | Becker et al. |
| 9,043,741 B2 | 5/2015 | Batterywala et al. |
| 9,071,446 B2 | 6/2015 | Kreft |
| 9,081,931 B2 | 7/2015 | Becker et al. |
| 9,117,050 B2 | 8/2015 | Becker et al. |
| 9,122,832 B2 | 9/2015 | Reed et al. |
| 9,152,754 B2 | 10/2015 | Knapp |
| 9,158,878 B2 | 10/2015 | Sakanushi |
| 9,159,627 B2 | 10/2015 | Smayling et al. |
| 9,202,779 B2 | 12/2015 | Kornachuk et al. |
| 9,208,279 B2 | 12/2015 | Becker et al. |
| 9,213,792 B2 | 12/2015 | Becker et al. |
| 9,230,910 B2 | 1/2016 | Becker |
| 9,240,413 B2 | 1/2016 | Smayling et al. |
| 9,243,081 B2 | 1/2016 | Becker et al. |
| 9,251,306 B2 | 2/2016 | Kim et al. |
| 9,269,702 B2 | 2/2016 | Quandt et al. |
| 9,281,371 B2 | 3/2016 | Smayling |
| 9,286,416 B2 | 3/2016 | Tyminski et al. |
| 9,292,643 B2 | 3/2016 | Sahouria et al. |
| 9,311,442 B2 | 4/2016 | Banerjee et al. |
| 9,336,344 B2 | 5/2016 | Smayling et al. |
| 9,361,417 B2 | 6/2016 | Arunachalam et al. |
| 9,390,215 B2 | 7/2016 | Fox et al. |
| 9,424,387 B2 | 8/2016 | Quandt et al. |
| 9,425,145 B2 | 8/2016 | Becker |
| 9,425,272 B2 | 8/2016 | Becker et al. |
| 9,425,273 B2 | 8/2016 | Becker et al. |
| 9,430,601 B2 | 8/2016 | Arunachalam |
| 9,443,947 B2 | 9/2016 | Becker et al. |
| 9,460,258 B2 | 10/2016 | Peart et al. |
| 9,461,826 B2 | 10/2016 | Kreft |
| 9,489,414 B2 | 11/2016 | Bruestle |
| 9,519,745 B2 | 12/2016 | Yuan et al. |
| 9,530,734 B2 | 12/2016 | Kornachuk et al. |
| 9,530,795 B2 | 12/2016 | Quandt et al. |
| 9,536,899 B2 | 1/2017 | Becker et al. |
| 9,563,733 B2 | 2/2017 | Becker |
| 9,589,091 B2 | 3/2017 | Smayling et al. |
| 9,595,091 B2 | 3/2017 | Kaizerman et al. |
| 9,595,515 B2 | 3/2017 | Becker et al. |
| 9,600,599 B2 | 3/2017 | Bruestle |
| 9,633,987 B2 | 4/2017 | Smayling et al. |
| 9,652,573 B1 | 5/2017 | Odiz et al. |
| 9,652,576 B2 | 5/2017 | Mihal et al. |
| 9,659,132 B2 | 5/2017 | Kerre et al. |
| 9,673,825 B2 | 6/2017 | Becker |
| 9,690,890 B1 | 6/2017 | Odiz et al. |
| 9,697,314 B1 | 7/2017 | Odiz et al. |
| 9,697,317 B1* | 7/2017 | Qian .................. G06F 17/5068 |
| 9,704,845 B2 | 7/2017 | Smayling et al. |
| 9,711,495 B2 | 7/2017 | Becker |
| 9,720,649 B2 | 8/2017 | Sahl et al. |
| 9,740,811 B2 | 8/2017 | Chen et al. |
| 9,740,812 B2 | 8/2017 | Nance et al. |
| 9,741,719 B2 | 8/2017 | Smayling et al. |
| 9,753,363 B2 | 9/2017 | Tyminski et al. |
| 9,754,066 B2 | 9/2017 | Moteki |
| 9,754,878 B2 | 9/2017 | Kornachuk et al. |
| 9,779,200 B2 | 10/2017 | Fox et al. |
| 9,792,396 B2 | 10/2017 | Arunachalam |
| 9,798,853 B2* | 10/2017 | Qian .................. G06F 17/5081 |
| 9,817,857 B2 | 11/2017 | Seth et al. |
| 9,818,747 B2 | 11/2017 | Smayling |
| 9,830,416 B2 | 11/2017 | Wu et al. |
| 9,858,658 B2 | 1/2018 | Kaizerman et al. |
| 9,859,277 B2 | 1/2018 | Smayling et al. |
| 9,871,056 B2 | 1/2018 | Becker et al. |
| 9,875,326 B2 | 1/2018 | Alpert et al. |
| 9,881,114 B2 | 1/2018 | Nifong et al. |
| 9,893,898 B2 | 2/2018 | Kreft |
| 9,898,567 B2 | 2/2018 | Salodkar et al. |
| 9,902,038 B2 | 2/2018 | Fukushima et al. |
| 9,904,755 B2 | 2/2018 | Bhattacharya et al. |
| 9,905,576 B2 | 2/2018 | Becker et al. |
| 9,910,950 B2 | 3/2018 | Quandt et al. |
| 9,916,411 B2 | 3/2018 | Nifong et al. |
| 9,917,056 B2 | 3/2018 | Smayling et al. |
| 2001/0003843 A1 | 6/2001 | Scepanovic et al. |
| 2001/0010090 A1 | 7/2001 | Boyle et al. |
| 2001/0010092 A1 | 7/2001 | Kato |
| 2001/0015464 A1 | 8/2001 | Tamaki |
| 2001/0032978 A1 | 10/2001 | Hiromi |
| 2001/0038127 A1 | 11/2001 | Yamazaki et al. |
| 2002/0002697 A1 | 1/2002 | Kotani et al. |
| 2002/0019729 A1 | 2/2002 | Chang et al. |
| 2002/0035461 A1 | 3/2002 | Chang et al. |
| 2002/0059553 A1 | 5/2002 | Eng |
| 2002/0061652 A1 | 5/2002 | Tamaki et al. |
| 2002/0063569 A1 | 5/2002 | Kanamoto |
| 2002/0073394 A1* | 6/2002 | Milor .................. G03F 1/36 716/53 |
| 2002/0088940 A1 | 7/2002 | Watanabe et al. |
| 2002/0100004 A1* | 7/2002 | Pierrat .................. G03F 1/36 716/53 |

(56) References Cited

U.S. PATENT DOCUMENTS

| | | |
|---|---|---|
| 2002/0133801 A1 | 9/2002 | Granik et al. |
| 2002/0138816 A1 | 9/2002 | Sarrafzedeh et al. |
| 2002/0147958 A1* | 10/2002 | Teig ................ G06F 17/5077 716/129 |
| 2002/0152453 A1 | 10/2002 | Rittman |
| 2002/0155363 A1 | 10/2002 | Cote et al. |
| 2002/0162079 A1* | 10/2002 | Igarashi .............. G06F 17/5077 257/774 |
| 2003/0022071 A1* | 1/2003 | Sugita ................... G03F 7/203 430/5 |
| 2003/0026472 A1 | 2/2003 | Abe |
| 2003/0044059 A1 | 3/2003 | Chang et al. |
| 2003/0061583 A1 | 3/2003 | Malhotra |
| 2003/0064685 A1 | 4/2003 | Kim |
| 2003/0079194 A1 | 4/2003 | Igarashi et al. |
| 2003/0084418 A1 | 5/2003 | Regan |
| 2003/0088847 A1 | 5/2003 | Chang et al. |
| 2003/0088849 A1 | 5/2003 | Yamauchi |
| 2003/0093766 A1 | 5/2003 | Liebmann et al. |
| 2003/0101430 A1 | 5/2003 | Liebmann et al. |
| 2003/0117946 A1 | 6/2003 | Fontana et al. |
| 2003/0126571 A1 | 7/2003 | Srinivasan et al. |
| 2003/0136977 A1 | 7/2003 | Tanaka |
| 2003/0160236 A1 | 8/2003 | Yamazaki et al. |
| 2003/0177467 A1 | 9/2003 | Ohnuma et al. |
| 2003/0196183 A1 | 10/2003 | Alpert et al. |
| 2003/0200524 A1 | 10/2003 | Liebmann et al. |
| 2003/0219154 A1 | 11/2003 | Medvedeva et al. |
| 2003/0229412 A1* | 12/2003 | White ................ G06F 17/5068 700/121 |
| 2003/0229838 A1 | 12/2003 | Hiraide |
| 2004/0003368 A1 | 1/2004 | Hsu et al. |
| 2004/0015808 A1 | 1/2004 | Pang et al. |
| 2004/0025138 A1 | 2/2004 | Futatsuya et al. |
| 2004/0049760 A1 | 3/2004 | Garza et al. |
| 2004/0063000 A1 | 4/2004 | Maurer et al. |
| 2004/0068712 A1 | 4/2004 | Heng et al. |
| 2004/0073880 A1 | 4/2004 | Yoshida et al. |
| 2004/0078768 A1 | 4/2004 | McGuinness et al. |
| 2004/0078770 A1 | 4/2004 | Miller et al. |
| 2001/0096752 | 5/2004 | Liebmann et al. |
| 2004/0088071 A1 | 5/2004 | Kouno et al. |
| 2004/0107408 A1 | 6/2004 | Sano et al. |
| 2004/0107410 A1 | 6/2004 | Misaka et al. |
| 2004/0123264 A1 | 6/2004 | Tsai et al. |
| 2004/0128118 A1 | 7/2004 | Croffie et al. |
| 2004/0153979 A1* | 8/2004 | Chang ................ G06F 17/5068 716/56 |
| 2004/0165054 A1 | 8/2004 | Saquib et al. |
| 2004/0170905 A1 | 9/2004 | Liebmann et al. |
| 2004/0175635 A1 | 9/2004 | Liebmann et al. |
| 2004/0191650 A1 | 9/2004 | Pierrat |
| 2004/0205681 A1 | 10/2004 | Nozuyama |
| 2004/0225986 A1 | 11/2004 | Lin et al. |
| 2004/0230922 A1 | 11/2004 | Allen et al. |
| 2004/0230933 A1 | 11/2004 | Weaver, Jr. et al. |
| 2004/0232445 A1 | 11/2004 | Nakamoto |
| 2004/0237061 A1 | 11/2004 | Kahng et al. |
| 2004/0243963 A1 | 12/2004 | Srinivasan et al. |
| 2005/0001271 A1 | 1/2005 | Kobayashi |
| 2005/0008942 A1 | 1/2005 | Cheng et al. |
| 2005/0014074 A1 | 1/2005 | Liebmann et al. |
| 2005/0015699 A1 | 1/2005 | Or-Bach |
| 2005/0034093 A1 | 2/2005 | Yamauchi |
| 2005/0041166 A1 | 2/2005 | Yamazaki et al. |
| 2005/0046717 A1 | 3/2005 | Lapstun et al. |
| 2005/0066300 A1 | 3/2005 | Zach |
| 2005/0091014 A1 | 4/2005 | Gallatin et al. |
| 2005/0096888 A1 | 5/2005 | Ismail |
| 2005/0100802 A1 | 5/2005 | Callan et al. |
| 2005/0108662 A1 | 5/2005 | Mortey et al. |
| 2005/0121672 A1 | 6/2005 | Yamazaki et al. |
| 2005/0125763 A1 | 6/2005 | Lin et al. |
| 2005/0132319 A1 | 6/2005 | Krauch et al. |
| 2005/0134820 A1 | 6/2005 | Mulder et al. |
| 2005/0134866 A1 | 6/2005 | Kyoh et al. |
| 2005/0136582 A1 | 6/2005 | Aller et al. |
| 2005/0155001 A1 | 7/2005 | Kinoshita et al. |
| 2005/0160390 A1 | 7/2005 | Bonges, III et al. |
| 2005/0160393 A1 | 7/2005 | Kobayashi |
| 2005/0172253 A1 | 8/2005 | Osanai |
| 2005/0175906 A1 | 8/2005 | Liebmann et al. |
| 2005/0188338 A1 | 8/2005 | Kroyan et al. |
| 2005/0229130 A1* | 10/2005 | Wu ................ G06F 17/5068 716/53 |
| 2005/0234684 A1 | 10/2005 | Sawicki et al. |
| 2005/0235237 A1 | 10/2005 | Alpert et al. |
| 2005/0235245 A1 | 10/2005 | Kotani et al. |
| 2005/0240895 A1 | 10/2005 | Smith |
| 2005/0242302 A1 | 11/2005 | Platzgummer et al. |
| 2005/0242303 A1 | 11/2005 | Platzgummer |
| 2005/0246674 A1 | 11/2005 | Scheffer |
| 2005/0246675 A1 | 11/2005 | Scheffer |
| 2005/0254106 A9 | 11/2005 | Silverbrook et al. |
| 2005/0286113 A1 | 12/2005 | Miles |
| 2005/0289490 A1 | 12/2005 | Shastri et al. |
| 2005/0289500 A1 | 12/2005 | Misaka et al. |
| 2006/0002216 A1 | 1/2006 | Ooishi |
| 2006/0026541 A1 | 2/2006 | Melvin et al. |
| 2006/0033049 A1 | 2/2006 | Kotani et al. |
| 2006/0033975 A1 | 2/2006 | Miles |
| 2006/0040188 A1 | 2/2006 | Liebmann et al. |
| 2006/0051680 A1 | 3/2006 | Tritchkov et al. |
| 2006/0057475 A1 | 3/2006 | Liebmann et al. |
| 2006/0064653 A1 | 3/2006 | Zhang et al. |
| 2006/0066326 A1 | 3/2006 | Slupsky |
| 2006/0080628 A1 | 4/2006 | Enomoto et al. |
| 2006/0080630 A1 | 4/2006 | Lin |
| 2006/0085768 A1 | 4/2006 | Heng et al. |
| 2006/0090151 A1 | 4/2006 | Miller et al. |
| 2006/0101356 A1 | 5/2006 | Allen et al. |
| 2006/0101357 A1 | 5/2006 | Allen et al. |
| 2006/0103002 A1 | 5/2006 | Ahn et al. |
| 2006/0107248 A1 | 5/2006 | Liebmann et al. |
| 2006/0110025 A1 | 5/2006 | Ho et al. |
| 2006/0110837 A1 | 5/2006 | Gupta et al. |
| 2006/0118719 A1 | 6/2006 | Watanabe et al. |
| 2006/0131271 A1 | 6/2006 | Kiermasz et al. |
| 2006/0131736 A1 | 6/2006 | Jansman et al. |
| 2006/0154496 A1 | 7/2006 | Imamura et al. |
| 2006/0161452 A1* | 7/2006 | Hess .................... G03F 1/36 716/55 |
| 2006/0168551 A1 | 7/2006 | Mukuno |
| 2006/0190889 A1 | 8/2006 | Cong et al. |
| 2006/0206847 A1 | 9/2006 | Ogawa |
| 2006/0242619 A1 | 10/2006 | Pang et al. |
| 2006/0245636 A1 | 11/2006 | Kitamura et al. |
| 2006/0265682 A1* | 11/2006 | Fujimura ............ G03F 7/70125 716/54 |
| 2006/0270068 A1 | 11/2006 | Lo |
| 2006/0271894 A1 | 11/2006 | Arunachalam |
| 2006/0277520 A1 | 12/2006 | Gennari |
| 2006/0281221 A1 | 12/2006 | Mehrotra et al. |
| 2006/0290769 A1 | 12/2006 | Liu et al. |
| 2007/0006113 A1 | 1/2007 | Hu et al. |
| 2007/0044061 A1 | 2/2007 | Nakamoto |
| 2007/0083847 A1 | 4/2007 | Mansfield et al. |
| 2007/0143724 A1 | 6/2007 | Alpert et al. |
| 2007/0150846 A1 | 6/2007 | Furnish et al. |
| 2007/0157153 A1 | 7/2007 | Croffie et al. |
| 2007/0168898 A1 | 7/2007 | Gupta et al. |
| 2007/0195511 A1 | 8/2007 | Imamura et al. |
| 2007/0198961 A1 | 8/2007 | Allen et al. |
| 2007/0204249 A1 | 8/2007 | Hibbeler |
| 2007/0204252 A1 | 8/2007 | Furnish et al. |
| 2007/0204256 A1 | 8/2007 | Brunet et al. |
| 2007/0220477 A1 | 9/2007 | Sagisaka et al. |
| 2007/0240088 A1 | 10/2007 | Tang et al. |
| 2007/0245281 A1 | 10/2007 | Riepe et al. |
| 2007/0245283 A1 | 10/2007 | Allen et al. |
| 2007/0246776 A1 | 10/2007 | Moroz et al. |
| 2007/0256046 A1 | 11/2007 | Pikus et al. |
| 2007/0271539 A1 | 11/2007 | Murray et al. |

(56) References Cited

U.S. PATENT DOCUMENTS

| | | |
|---|---|---|
| 2007/0271543 A1 | 11/2007 | Alpert et al. |
| 2007/0277129 A1 | 11/2007 | Allen et al. |
| 2008/0028352 A1* | 1/2008 | Birch .................. G06F 17/5077 716/112 |
| 2008/0052660 A1 | 2/2008 | Shim et al. |
| 2008/0067552 A1 | 3/2008 | Yamauchi |
| 2008/0074913 A1 | 3/2008 | Yamauchi |
| 2008/0084726 A1 | 4/2008 | Yamauchi |
| 2008/0120588 A1 | 5/2008 | Becker |
| 2008/0127017 A1 | 5/2008 | Alpert et al. |
| 2008/0127027 A1 | 5/2008 | Gallatin et al. |
| 2008/0127029 A1 | 5/2008 | Graur et al. |
| 2008/0134128 A1 | 6/2008 | Blatchford et al. |
| 2008/0141211 A1 | 6/2008 | Bruce et al. |
| 2008/0148210 A1 | 6/2008 | Heng et al. |
| 2008/0163486 A1 | 7/2008 | Imamura et al. |
| 2008/0173814 A1 | 7/2008 | Watanabe et al. |
| 2008/0184183 A1 | 7/2008 | Kobayashi |
| 2008/0216025 A1 | 9/2008 | Furnish et al. |
| 2008/0216038 A1 | 9/2008 | Bose |
| 2008/0216039 A1 | 9/2008 | Furnish et al. |
| 2008/0216040 A1 | 9/2008 | Furnish et al. |
| 2008/0238967 A1 | 10/2008 | Busch et al. |
| 2008/0241709 A1 | 10/2008 | Nakagawa et al. |
| 2008/0244494 A1 | 10/2008 | McCullen |
| 2008/0250375 A1 | 10/2008 | Miller et al. |
| 2008/0276208 A1 | 11/2008 | Albrecht et al. |
| 2008/0276209 A1 | 11/2008 | Albrecht et al. |
| 2008/0276210 A1 | 11/2008 | Albrecht et al. |
| 2008/0276212 A1 | 11/2008 | Albrecht |
| 2008/0313577 A1 | 12/2008 | Tang et al. |
| 2009/0003684 A1 | 1/2009 | Alqudah et al. |
| 2009/0004573 A1 | 1/2009 | Aton |
| 2009/0013299 A1 | 1/2009 | Alpert et al. |
| 2009/0014811 A1 | 1/2009 | Becker et al. |
| 2009/0019419 A1 | 1/2009 | Misaka et al. |
| 2009/0031259 A1 | 1/2009 | Gray et al. |
| 2009/0031269 A1 | 1/2009 | Chen et al. |
| 2009/0032967 A1 | 2/2009 | Becker et al. |
| 2009/0037850 A1 | 2/2009 | Gray et al. |
| 2009/0037851 A1 | 2/2009 | Gray et al. |
| 2009/0037866 A1 | 2/2009 | Graur et al. |
| 2009/0064073 A1 | 3/2009 | Alpert et al. |
| 2009/0064074 A1 | 3/2009 | Alpert et al. |
| 2009/0064080 A1 | 3/2009 | Alpert et al. |
| 2009/0077525 A1 | 3/2009 | Haffner |
| 2009/0083689 A1 | 3/2009 | Ringe et al. |
| 2009/0087619 A1 | 4/2009 | Aton et al. |
| 2009/0106715 A1 | 4/2009 | Pikus |
| 2009/0108360 A1 | 4/2009 | Smayling et al. |
| 2009/0128788 A1 | 5/2009 | Aton |
| 2009/0132992 A1 | 5/2009 | Zhou et al. |
| 2009/0150837 A1 | 6/2009 | Mergenthaler et al. |
| 2009/0158223 A1 | 6/2009 | Gray et al. |
| 2009/0160986 A1 | 6/2009 | Moini et al. |
| 2009/0199142 A1 | 8/2009 | Arunachalam et al. |
| 2009/0222672 A1 | 9/2009 | Clarke et al. |
| 2009/0241085 A1 | 9/2009 | De La Cruz et al. |
| 2009/0254874 A1 | 10/2009 | Bose |
| 2009/0261493 A1 | 10/2009 | Winget et al. |
| 2009/0271752 A1 | 10/2009 | Alpert et al. |
| 2009/0296055 A1 | 12/2009 | Ye et al. |
| 2009/0307642 A1 | 12/2009 | Lai et al. |
| 2009/0313594 A1 | 12/2009 | Arunachalam |
| 2009/0319977 A1 | 12/2009 | Saxena et al. |
| 2010/0002111 A1 | 1/2010 | Yourlo et al. |
| 2010/0014784 A1 | 1/2010 | Silverbrook et al. |
| 2010/0031214 A1 | 2/2010 | Hou et al. |
| 2010/0037200 A1 | 2/2010 | Ghan et al. |
| 2010/0115477 A1 | 5/2010 | Albrecht et al. |
| 2010/0125822 A1 | 5/2010 | Lepere et al. |
| 2010/0153892 A1 | 6/2010 | Gray et al. |
| 2010/0185997 A1 | 7/2010 | Allen et al. |
| 2010/0252889 A1 | 10/2010 | Becker |
| 2010/0257499 A1 | 10/2010 | Alpert et al. |
| 2010/0262944 A1 | 10/2010 | Alpert et al. |
| 2010/0302426 A1 | 12/2010 | Moini et al. |
| 2010/0306719 A1 | 12/2010 | Smayling |
| 2010/0333049 A1 | 12/2010 | Agarwal et al. |
| 2011/0037498 A1 | 2/2011 | Konda |
| 2011/0047519 A1 | 2/2011 | Torres Robles et al. |
| 2011/0119642 A1 | 5/2011 | Agarwal et al. |
| 2011/0138342 A1 | 6/2011 | Agarwal |
| 2011/0167397 A1 | 7/2011 | Huckabay et al. |
| 2011/0191731 A1 | 8/2011 | Walker et al. |
| 2011/0191738 A1 | 8/2011 | Walker et al. |
| 2011/0202897 A1 | 8/2011 | Hsu et al. |
| 2011/0209106 A1 | 8/2011 | Cheng et al. |
| 2011/0252389 A1 | 10/2011 | Albrecht et al. |
| 2011/0320992 A1 | 12/2011 | Alpert et al. |
| 2012/0012851 A1 | 1/2012 | Yamazaki et al. |
| 2012/0036488 A1 | 2/2012 | Arunachalam et al. |
| 2012/0054699 A1 | 3/2012 | Cho et al. |
| 2012/0054707 A1 | 3/2012 | Goodman et al. |
| 2012/0066654 A1 | 3/2012 | Hopkins et al. |
| 2012/0124539 A1 | 5/2012 | Alpert et al. |
| 2012/0144358 A1 | 6/2012 | Alpert et al. |
| 2012/0151420 A1 | 6/2012 | Barowski et al. |
| 2012/0198394 A1 | 8/2012 | Pikus et al. |
| 2012/0266124 A1 | 10/2012 | Alpert et al. |
| 2012/0269190 A1 | 10/2012 | Konda |
| 2012/0284682 A1 | 11/2012 | Arunachalam |
| 2012/0324409 A1 | 12/2012 | Alpert et al. |
| 2013/0007674 A1 | 1/2013 | Abou Ghaida et al. |
| 2013/0042217 A1 | 2/2013 | Heng et al. |
| 2013/0047127 A1 | 2/2013 | Arunachalam |
| 2013/0047130 A1 | 2/2013 | Daellenbach et al. |
| 2013/0086543 A1 | 4/2013 | Agarwal et al. |
| 2013/0097573 A1 | 4/2013 | Kim et al. |
| 2013/0105805 A1 | 5/2013 | Yamazaki et al. |
| 2013/0205272 A1 | 8/2013 | Kim et al. |
| 2013/0279790 A1 | 10/2013 | Kaizerman et al. |
| 2014/0149957 A1 | 5/2014 | Alpert et al. |
| 2014/0331196 A1 | 11/2014 | Helvey |
| 2014/0337811 A1 | 11/2014 | Knapp |
| 2015/0095865 A1 | 4/2015 | Bhattacharya et al. |
| 2015/0213159 A1 | 7/2015 | Arunachalam |
| 2015/0220674 A1 | 8/2015 | Mihal et al. |
| 2015/0227646 A1 | 8/2015 | Arunachalam et al. |
| 2015/0248514 A1 | 9/2015 | Salodkar et al. |
| 2015/0331907 A1 | 11/2015 | Bruestle |
| 2015/0347088 A1 | 12/2015 | Bruestle |
| 2015/0379105 A1 | 12/2015 | Knapp |
| 2016/0103940 A1 | 4/2016 | Kerre et al. |
| 2016/0117432 A1 | 4/2016 | Yuan et al. |
| 2016/0129341 A1 | 5/2016 | Sahl et al. |
| 2016/0232272 A1 | 8/2016 | Liu et al. |
| 2016/0335376 A1 | 11/2016 | Arunachalam |
| 2016/0371424 A1 | 12/2016 | Qian |
| 2017/0004249 A1 | 1/2017 | Feng et al. |
| 2017/0097809 A1 | 4/2017 | Bruestle |
| 2017/0147542 A1 | 5/2017 | Bruestle |
| 2017/0161407 A1 | 6/2017 | Alpert et al. |
| 2017/0206298 A1 | 7/2017 | Wu et al. |
| 2017/0323047 A1 | 11/2017 | Hsu et al. |
| 2018/0010485 A1 | 1/2018 | Sahl et al. |
| 2018/0011963 A1* | 1/2018 | Qian .................. G06F 17/5081 |

FOREIGN PATENT DOCUMENTS

| | | |
|---|---|---|
| EP | 1146393 A2 | 4/2000 |
| EP | 1925020 A4 | 9/2006 |
| JP | 4071502 B2 | 7/2003 |
| JP | 2004302932 A | 10/2004 |
| JP | 2007264475 A | 10/2007 |
| JP | 2008258361 A | 10/2008 |
| KR | 100542532 B1 | 9/2003 |
| KR | 100529619 B1 | 6/2005 |
| KR | 100640479 B1 | 12/2005 |
| KR | 20080005374 A | 4/2006 |
| NL | 2008966 A | 6/2012 |
| WO | WO1999014638 A1 | 9/1997 |
| WO | WO1999014636 A1 | 3/1999 |
| WO | WO1999014706 | 3/1999 |

(56) References Cited

FOREIGN PATENT DOCUMENTS

| WO | WO1999014706 A2 | 3/1999 |
|---|---|---|
| WO | WO2002009152 A3 | 1/2002 |
| WO | WO2002044699 A2 | 6/2002 |
| WO | WO2004061898 A9 | 7/2004 |
| WO | WO2005109256 A3 | 5/2006 |
| WO | WO2006127408 A3 | 11/2006 |
| WO | WO2006127438 A3 | 11/2006 |
| WO | WO2007041600 A3 | 4/2007 |
| WO | WO2007147826 A1 | 12/2007 |
| WO | WO2008031744 A1 | 3/2008 |

OTHER PUBLICATIONS

Heng et. al., "A VLSI Artwork Legalization Technique Based on a New Criteria of Minimum Layout Perturbation", ACMIIEEE Intl. Symp. on Physical Design, pp. 116-121, 1997.*
IYM v. AMD, Case 1:16-cv-00649-GMS, Apr. 5, 2017 _IYM Invalidity Contentions.
IYM v. AMD, Case 1:16-cv-00649-GMS, Apr. 5, 2017 IYM Invalidity Contentions Exhibit 1—Invalidity Claim Chart—U.S. Pat. No. 7,194,725.
IYM v. AMD, Case 1:16-cv-00649-GMS, Apr. 5, 2017 IYM Invalidity Contentions Exhibit 2—Invalidity Claim Chart—U.S. Pat. No. 7,523,429.
IYM v. AMD, Case 1:16-cv-00649-GMS, Apr. 5, 2017 IYM Invalidity Contentions Exhibit 3—Invalidity Claim Chart—U.S. Pat. No. 6,745,372.
IYM v. AMD, Case 1:16-cv-00649-GMS, Apr. 5, 2017 IYM Invalidity Contentions Exhibit 4—Invalidity Claim Chart—Allan.
IYM v. AMD, Case 1:16-cv-00649-GMS, Apr. 5, 2017 IYM Invalidity Contentions Exhibit 5—Invalidity Claim Chart—Chiluvuri.
IYM v. AMD, Case 1:16-cv-00649-GMS, Jan. 17, 2018 Opening Expert Report of Dr. Nagel re Invalidity of U.S. Pat. No. 7,448,012 with Exhibit A.
IYM v. AMD, Case 1:16-cv-00649-GMS, Mar. 13, 2018 Reply Expert Report of Dr. Laurence W. Nagel re Invalidity of U.S. Pat. No. 7,448,012.
IYM v. AMD, Case 1:16-cv-00649-GMS, AMDs Opening Claim Construction Brief.
IYM v. AMD, Case 1:16-cv-00649-GMS, DI_012 Sep. 22, 2016 AMD Brief re motion to dismiss.
IYM v. AMD, Case 1:16-cv-00649-GMS, DI_017.00 Oct. 26, 2016 IYM response to motion to dismiss.
IYM v. AMD, Case 1:16-cv-00649-GMS, DI_019 Nov. 26, 2016 AMD reply brief.
IYM v. AMD, Case 1:16-cv-00649-GMS, DI_074 Jul. 20, 2017 AMD responsive claim construction brief.
IYM v. AMD, Case 1:16-cv-00649-GMS. IYMs Opening Claim Construction Brief.
IPR2017-001888 Petition for Inter Partes Review.
IPR2017-001888 Power of Attorney.
IPR2017-001888 Exhibit 1001—U.S. Pat. No. 7,448,012.
IPR2017-001888 Exhibit 1002—Declaration of Laurence W. Nagel, Ph.D.
IPR2017-001888 Exhibit 1003—CV of Laurence W. Nagel, Ph.D.
IPR2017-001888 Exhibit 1004—U.S. Pat. No. 6,745,372 (Cote).
IPR2017-001888 Exhibit 1005—U.S. Pat. No. 5,663,891 (Bamji).
IPR2017-001888 Exhibit 1006—U.S. Pat. No. 7,523,429 (Kroyan).
IPR2017-001888 Exhibit 1007—U.S. Pat. No. 6,249,904 (Cobb).
IPR2017-001888 Exhibit 1008—U.S. Pub. No. 2003/0061583 (Malhotra).
IPR2017-001888 Exhibit 1009—U.S. Pat. No. 7,194,725 (Lukanc).
IPR2017-001888 Exhibit 1010—U.S. Pat. No. 5,519,628 (Russell).
IPR2017-001888 Exhibit 1011—Mead and Conway, Introduction to VLSI Systems, 1980.
IPR2017-001888 Exhibit 1012—Tsividis, Operation and Modeling of the MOS Transistor, 1987.
IPR2017-001888 Exhibit 1013—Rabaey, Digital Integrated Circuits—A Design Perspective, 1996.
IPR2017-001888 Exhibit 1014—Weste and Eshragian, Principles of CMOS VLSI Design—A Systems Perspective, 1993.
IPR2017-001888 Exhibit 1015—An Yield Improvement Technique for IC Layout Using Local Design Rules, 1992 (Allan).
IPR2017-001888 Exhibit 1016—File History of U.S. Pat. No. 7,448,012.
IPR2017-001888 Exhibit 1017—IYM v. AMD, Case No. 16-cv-00649, Dkt No. 71 (Plaintiff's Opening Claim Construction Brief) (Jun. 22, 2017 D. Del.).
IPR2017-001888 Exhibit 1018—Excerpts of File History of U.S. Pat. No. 6,745,372 (Cote).
IPR2017-001888 Exhibit 1019—Nagel, A Unified Circuit Model for Bipolar Transistors Including Quasi-Saturation Effects, 1985.
IPR2017-001888 Exhibit 1020—Pre-2004 IEEE Publications Citing Allan (Ex. 1015).
IPR2017-001888 Exhibit 1021—Information Disclosure Sheet and Allan from prosecution of application leading to U.S. Pat. No. 7,134,102.
IPR2017-001888 Exhibit 1022—Information Disclosure Sheet and Allan from prosecution of application leading to U.S. Pat. No. 7,346,865.
IPR2017-001888 Exhibit 1023—McGraw-Hill Dictionary of Scientific and Technical Terms, 988 (6th ed. 2002).
IPR2017-001888 Exhibit 1024—Information Disclosure Sheet and Allan from prosecution of application leading to U.S. Pat. No. 7,698,676.
IPR2017-001888 Patent Owner's Power of Attorney Pursuant to 37 C.F.R. 42.10(B).
IPR2017-001888 Patent Owner's Mandatory Notices Pursuant to 37 C.F.R. 42.8.
IPR2017-001888 Petitioners' Corrected Exhibit List.
IPR2017-001888 Patent Owner's Preliminary Response.
IPR2017-001888 Exhibit 2001—U.S. Pat. No. 6,978,438.
IPR2017-001888 Exhibit 2003—McGraw-Hill Dictionary of Math Excerpts.
IPR2017-001888 Exhibit 2004—MPEP E8R5 719.05.
IPR2017-001888 Exhibit 2006—MPEP 1948.
IPR2017-001888 Exhibit 2008—UPWS Searchable Index East Main Menu.
IPR2017-001888 Exhibit 2011—U.S. Pat. No. 5,825,660.
IPR2017-001888 Exhibit 2002—1996 IEEE Standard Dictionary Excerpts.
IPR2017-001888 Exhibit 2005—MPEP E8R5 904.
IPR2017-001888 Exhibit 2007—US Quick Reference Guide for East and West.
IPR2017-001888 Exhibit 2009—Cote file history—search notes.
IPR2017-001888 Exhibit 2010—U.S. Pat. No. 5,559,718.
IPR2017-001888 Patent Owner's Objections to Evidence Submitted With Petition.
IPR2017-001888 Notice of Accord Filing Date.
IPR2017-001888 Order—Conduct of the Proceeding.
IPR2017-001888 Decision Granting Institution of Inter Partes Review.
IPR2017-001888 Scheduling Order.
IPR2017-01886 Exhibit 1002—Declaration of Laurence W. Nagel, Ph.D.
IPR2017-001886 Exhibit 1005—U.S. Pat. No. 5,663,891 (Bamji).
IPR2017-001886 Exhibit 1011—Mead and Conway, Introduction to VLSI Systems, 1980.
IPR2017-001886 Exhibit 1013—Rabaey, Digital Integrated Circuits—A Design Perspective, 1996.
IPR2017-001886 Petition for Inter Partes Review.
IPR2017-001886 Power of Attorney.
IPR2017-001886 Exhibit 1001—U.S. Pat. No. 7,448,012.
IPR2017-001886 Exhibit 1003—CV of Laurence W. Nagel, Ph.D.
IPR2017-001886 Exhibit 1004—U.S. Pat. No. 6,745,372 (Cote).
IPR2017-001886 Exhibit 1006—U.S. Pat. No. 7,523,429 (Kroyan).
IPR2017-001886 Exhibit 1007—U.S. Pat. No. 6,249,904 (Cobb).
IPR2017-001886 Exhibit 1008—U.S. Pub. No. 2003/0061583 (Malhotra).
IPR2017-001886 Exhibit 1009—U.S. Pat. No. 7,194,725 (Lukanc).
IPR2017-001886 Exhibit 1010—U.S. Pat. No. 5,519,628 (Russell).
IPR2017-001886 Exhibit 1012—Tsividis, Operation and Modeling of the MOS Transistor, 1987.

(56) References Cited

OTHER PUBLICATIONS

IPR2017-001886 Exhibit 1014—Weste and Eshragian, Principles of CMOS VLSI Design—A Systems Perspective, 1993.
IPR2017-001886 Exhibit 1015—An Yield Improvement Technique for IC Layout Using Local Design Rules, 1992 (Allan).
IPR2017-001886 Exhibit 1016—File History of U.S. Pat. No. 7,448,012.
IPR2017-001886 Exhibit 1017—*IYM* v. *AMD*, Case No. 16-cv-00649, Dkt No. 71 (Plaintiff's Opening Claim Construction Brief) (Jun. 22, 2017 D. Del.).
IPR2017-001886 Exhibit 1018—Excerpts of File History of U.S. Pat. No. 6,745,372 (Cote).
IPR2017-001886 Exhibit 1019—Nagel, A Unified Circuit Model for Bipolar Transistors Including Quasi-Saturation Effects, 1985.
IPR2017-001886 Exhibit 1020—Pre-2004 IEEE Publications Citing Allan (Ex. 1015).
IPR2017-001886 Exhibit 1021—1021 Information Disclosure Sheet and Allan from prosecution of application leading to U.S. Pat. No. 7,134,102.
IPR2017-001886 Exhibit 1022—Information Disclosure Sheet and Allan from prosecution of application leading to U.S. Pat No. 7,346,865.
IPR2017-001886 Exhibit 1023—McGraw-Hill Dictionary of Scientific and Technical Terms, 988 (6th ed. 2002).
IPR2017-001886 Exhibit 1024—Information Disclosure Sheet and Allan from prosecution of application leading to U.S. Pat. No. 7,698,676.
IPR2017-001886 Patent Owner's Power of Attorney Pursuant to 37 C.F.R. 42.10(B).
IPR2017-001886 Patent Owner's Mandatory Notices Pursuant to 37 C.F.R. 42.8.
IPR2017-001886 Petitioners' Corrected Exhibit List.
IPR2017-001886 Exhibit 2002—1996 IEEE Standard Dictionary Excerpts.
IPR2017-001886 Exhibit 2004—MPEP E8R5 719.05.
IPR2017-001886 Exhibit 2005—MPEP E8R5 904.
IPR2017-001886 Exhibit 2006—MPEP 1948.
IPR2017-001886 Exhibit 2007—US Quick Reference Guide for East and West.
IPR2017-001886 Exhibit 2010—U.S. Pat. No. 5,559,718.
IPR2017-001886 Exhibit 2011—U.S. Pat. No. 5,825,660.
IPR2017-001886 Patent Owner's Preliminary Response.
IPR2017-001886 Exhibit 2001—U.S. Pat. No. 6,978,438.
IPR2017-001886 Exhibit 2003—McGraw-Hill Dictionary of Math Excerpts.
IPR2017-001886 Exhibit 2008—UPWS Searchable Index East Main Menu.
IPR2017-001886 Exhibit 2009—Cote file history—search notes.
IPR2017-001886 Patent Owner's Objections to Evidence Submitted With Petition.
IPR2017-001886 Notice of Filing Date Accorded to Petition and Time for Filing Patent Owner Preliminary Response.
IPR2017-001886 Scheduling Order.
IPR2017-001886 Decision Granting Institution of Inter Partes Review.

\* cited by examiner

INTEGRATED CIRCUITS HAVING IN-SITU CONSTRAINTS

CROSS REFERENCE RELATED APPLICATIONS

This application claims priority to, and is a division of, and U.S. patent application Ser. No. 15/715,097, filed Sep. 25, 2017, which is a continuation of U.S. patent application Ser. No. 15/251,961, filed Aug. 30, 2016, now U.S. Pat. No. 9,798,853, issued Oct. 24, 2017, which is a continuation of U.S. patent application Ser. No. 13/886,577, filed May 3, 2013, now U.S. Pat. No. 9,697,317, issued Jul. 4, 2017, which is a continuation of U.S. patent application Ser. No. 13/547,444, filed on Jul. 12, 2012, now U.S. Pat. No. 8,464,187, issued Jun. 11, 2013, which is a continuation of U.S. patent application Ser. No. 12/181,483 filed on Jul. 29, 2008, now U.S. Pat. No. 8,266,557, issued Sep. 11, 2012, which is a divisional of U.S. patent application Ser. No. 10/907,814, filed on Apr. 15, 2005, now U.S. Pat. No. 7,448,012, issued Nov. 4, 2008, which claims priority to U.S. Provisional Patent Application Ser. No. 60/603,758 filed on Aug. 23, 2004, and U.S. Provisional Patent Application Ser. No. 60/564,082, filed on Apr. 21, 2004, each of which is expressly incorporated herein in their entirety.

FIELD OF THE INVENTION

The present invention relates generally to integrated-circuit devices and more particularly to integrated-circuit devices having superior manufacturing yield.

PRIOR ART

In modern processing technology, the manufacturing yield of an integrated circuit depends heavily on its layout construction. For a given manufacturing process, a corresponding set of design rules are applied during chip layout to avoid geometry patterns that can cause chip failure. These design rules guarantee the yield by limiting layout geometry parameters such as minimum spacing, minimal line width, etc.

Existing layout construction systems apply design rules over a wide chip area, and to entire classes of circuits. For this reason, the design rule must cover the worst case in all products. Failure to capture the absolute worst case in all chips would lead to systematic yield failure.

In modern processing technologies such as advanced photolithography, many layout features may interact during chip processing. When the interaction distance increases to greater than a few minimal pitches, the number of interacting features increases sharply. For this reason, the feature dependent interactions are difficult to capture with precise design rules. In practice, one makes global design rule sufficiently relaxed in order to guarantee the yield.

The drawback of this approach is at least two fold: firstly, it clearly wastes chip area, and secondly, finding the worst case feature combination in all chips is a non-trivial task that consumes large engineering resources.

Some emerging processing technologies also prefer one spatial direction to the other. Existing layout generation systems, however, use identical minimal spacing and minimal width rules for both directions. This leads to waste in chip area and under-utilization of processing capability, since the design rules must cover the worst of the two directions.

SUMMARY OF INVENTION

The present invention relates to layout with geometric objects, and more particularly to a system and method for forming layout constraints to account for local and orientation processing dependencies.

The present invention provides a local process modification value to the basic design rule constraint. Local process modification represents an additional safeguard distance beyond the design rule constraint distance. The local process modification value can be calculated from simulated process responses in the region of interest, with a predetermined, often empirical, equation, or from look-up data tables. The original design rule distance plus local process modification effectively creates a new constraint for every unique local situation. With this additional local safeguard, we can reduce the guard band in design rule formulation and improve chip yield by eliminating processing hotspots arising from low probability local feature combinations.

The present invention provides a method that enforces the new local constraints such that simulated local process modification and the original design rule constraint work together to guarantee the chip yield.

For processing technologies with a preferred direction, the present invention constructs two sets of design rule constraint distances for the two orthogonal spatial directions. It constructs layout design systems that can read, store said constraint distances in different memory locations, and apply them according to the orientation of the layout features. By doing so, the layout can fully take advantage of the directional dependence in processing technology.

BRIEF DESCRIPTION OF THE DRAWINGS

The invention is generally shown by way of example in the accompanying drawings in which.

DEFINITION LIST 2

| Term | Definition |
| --- | --- |
| Width | Distance of interior-facing edge for a single layer |
| Space | Distance of exterior-facing edge for one or two layers |
| Overlap | Distance of interior-facing edge for two layers |
| Enclosure | Distance of inside edge to outside edge when the polygon of the inside edge is fully inside the polygon of the outside edge |
| Extension | Distance of inside edge to outside edge |

DETAILED DESCRIPTION OF THE PREFERRED EMBODIMENTS

Some preferred embodiments of the present invention will be described in detail with reference to the related drawings of FIGS. 1-8. Additional embodiments, features and/or advantages of the invention will become apparent from the ensuing description or may be learned by the practice of the invention.

The methods and apparatus described here are with respect to integrated circuit manufacturing; however, the techniques described here can be applied to manufacturing or design of any device that require pattern transfer from a polygon database drawing to physical materials using lithographic and/or etch methods. Examples of these include integrated optical devices, microelectromechanical systems (MEMS), gene chips, micromachines, disk drive heads, etc.

The following description includes the best mode presently contemplated for carrying out the invention. This description is not to be taken in a limiting sense, but is made merely for describing the general principles of the invention.

The present invention is directed to methods for improving the manufacturing yield of an IC by optimizing its layout pattern.

Figure 1:
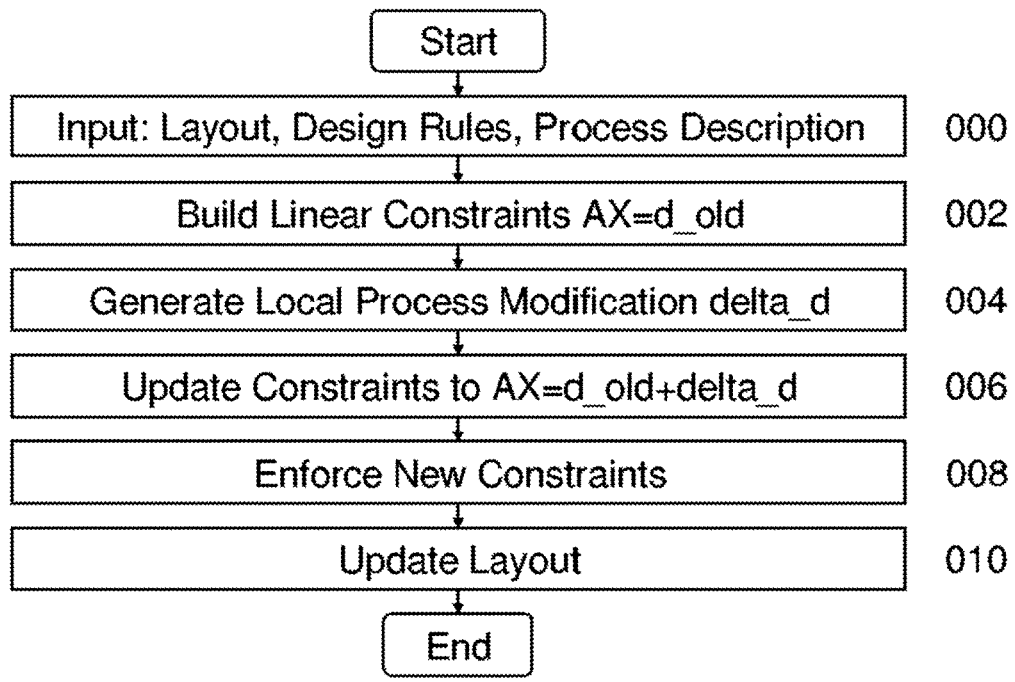
FIG. 1 is a flow and block diagram showing a method and system in accordance with the present invention.

FIG. 1 shows a block and flow diagram for the present invention. In block 000, the original design layout and process description are read into the system. Said design layout comprises a plurality of interrelated layout objects, one or more layers, and can be flat or organized in a hierarchical data structure comprising a plurality of masters, cells, and/or array instances. The relative distances between said layout objects are constrained by design rule and design intent.

The process description comprises design rules, simulation models, manufacturing equipment settings, material options, empirical fitting parameter, and look-up data tables that describe the manufacturing behavior.

Block 002 builds initial linear constraints from the input layout, design rules, and circuit requirements. In a preferred embodiment, well-known procedures, such as the shadow propagation method; is applied to accomplish this task. A description of the procedure can be found in Jurgen Doenhardt and Thomas Lengauer, "Algorithm Aspects of One-Dimensional Layout Compaction", IEEE Trans. Computer-Aided design. Vol. CAD-6 no. 5 Sep. 1987. pp. 863.

Said initial linear constraint equation takes the form $AX=d\_old$, where A is a matrix of coefficients; X is a vector of positional variables comprising location of the polygon edges; and d_old is a column vector of constraint distances. Constraint distances comprise design rule constraint distances and circuit specific design intent. An example of a constraint distance is the minimal line width.

A constraint equation is expressed in the form $xi-xj>dij\_old$, where xi and xj are locations of two interacting polygon edges in the layout, and dij_old is the constraint distance between these two edges. The elements of matrix A in this equation are 1 and −1. The vector d_old is a collection of dij_old. The value of dij_old is given by the design rule or by circuit requirements. For example, dij_old can be the minimal width of a wire as required by process capabilities. In another case, it dij_old is the width of a particular wire that is designed to carry a large amount of current where it would be wider than the minimal wire width required by the process alone.

Block 004 generates local process modification values. A local process modification to the design rule constraint distance transforms the global design rule constraints into location specific constraints. Individual evaluation and enforcement of the required safety margin at each critical location enhances the manufacturing yield of a chip. In a preferred embodiment, we calculate local process modification at constrained locations from manufacturing response variables. Details of a preferred embodiment will be discussed in FIG. 3.

Block 006 combines local process modification value delta_dij, with the original constraint distances generated in block 002. A linear constraint equation now takes the form $xi-xj>dij\_new$, where $dij\_new=dij\_old+delta\_dij$ is defined as the local constraint distance. A collection of dij_new values forms the local constraint distance vector, d_new. The system of equations for local constraint takes the form $A*X=d\_new$.

Local constraint distance is a general addition to the constraint distance specified by design rules. Therefore, it can be applied to any physical design system where design rule constrained layout construction and optimization is performed.

Block 008 enforces the local constraint distance to the original layout. Preferred embodiments will be illustrated in FIG. 2.

Block 010 updates the coordinate variables in the layout according to the solution of the enforcement procedure 008.

The present invention modifies a design rule constraint distance, which is global in nature, with a local process modifier to account for specific local conditions. This mechanism adds extra safeguard to the design rule methodology. If a design rule clean layout contains locations with poor process latitude, the local process modifier delta_dij will be larger than that in other places. By enforcing the new local constraint, $dij\_new=dij\_old+delta\_dij$, the layout is modified to have better process latitude.

For example if two minimally spaced lines tend to bridge due to a particular surrounding condition, the local process modifier will increase the minimal spacing between them, causing the layout edges to moved further apart during enforcement.

Figure 2:
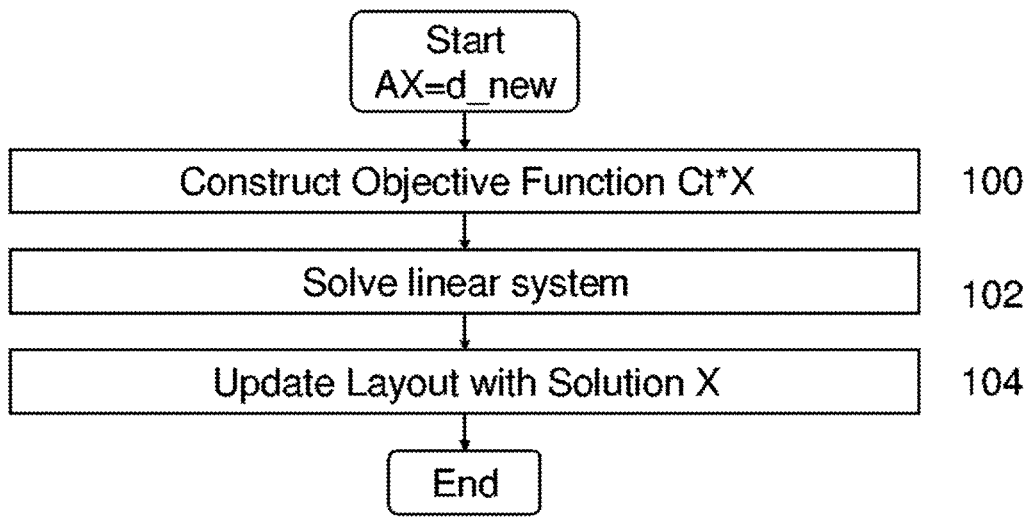
FIG. 2 is a flow and block diagram for enforcing local constraints.

FIG. 2 shows a preferred embodiment for local constraint enforcement. At the start of the procedure, we have a system of equations for local constraint, $AX=d\_new$. The edge locations in the original layout are likely to violate some of the local constraint distances.

Block 100 constructs an objective function $Ct*X$, where Ct is a row vector of coefficients for achieving various optimization objectives, and X is the position variable in the layout. In a preferred embodiment, the objective function together with the linear constraint system removes the new violations introduced by local constraint with minimal perturbation. For example, we can use the procedure described by Heng et. al. entitled "A VLSI Artwork Legalization Technique Based on a New Criteria of Minimum Layout Perturbation", ACM/IEEE Intl. Symp. on Physical Design, pp. 116-121, 1997.

By receiving appropriate Ct values, we construct objective functions for wire length minimization, legalization, compaction, and other measurable metrics of layout.

Block 102 solves the linear system problem of minimizing $Ct*X$, subject to $A*X=d\_new$. This is a standard form for a linear programming problem. We use commercial software packages such as CPLEX from ILOG can be used for this purpose.

Block 104 updates the layout with the solution X of the linear system.

In q one-dimensional method, the flow is performed one direction at a time, first x(y) then y(x).

In a two-dimension method, the flow is performed for horizontal and vertical position variables simultaneously.

In another preferred embodiment, the violations to local constraints are removed one at a time using heuristic procedures. For example, the single error removal procedure described by Zhan Chen, in "Layout and Logic Techniques for Yield and Reliability Enhancement", Ph.D. Thesis, University of Massachusetts Amherst, 1998, can be applied to fix isolated violations. It is particularly useful when processing hotspots are few.

By enforcing new local constraints, we improve the local process latitude. It is a function similar to optimal process correction (OPC). By enforcing local constraints, we can eliminate the need to perform OPC in large portion of layout. In a preferred embodiment, we tag locations where local constraint enforcement fails or the circuit tolerance is especially tight so that a specially designed OPC system can pick up these location tags and perform localized OPC.

Our experiments show that only small percentages of locations need OPC after local constraint enforcement. Therefore, the localized OPC procedure will greatly reduce the mask complexity compared to the standard, blanket OPC procedure performed today.

According to the present invention, we calculate the local process modification value at a set of control points that best captures the interaction between the edges. In a preferred embodiment, a simulation based hotspot detection procedure is first applied to the layout. After that, control points are placed on the offending polygon edges. Hotspot detection comprises simulating the image of the layout and measuring the difference between said image and the design intent. In a preferred embodiment, the difference is represented by the edge placement error (EPE). A processing hotspot is a location where EPE is larger than a predetermined threshold. As an example, the control points can be the same points on the layout where EPE is evaluated.

Figure 3:
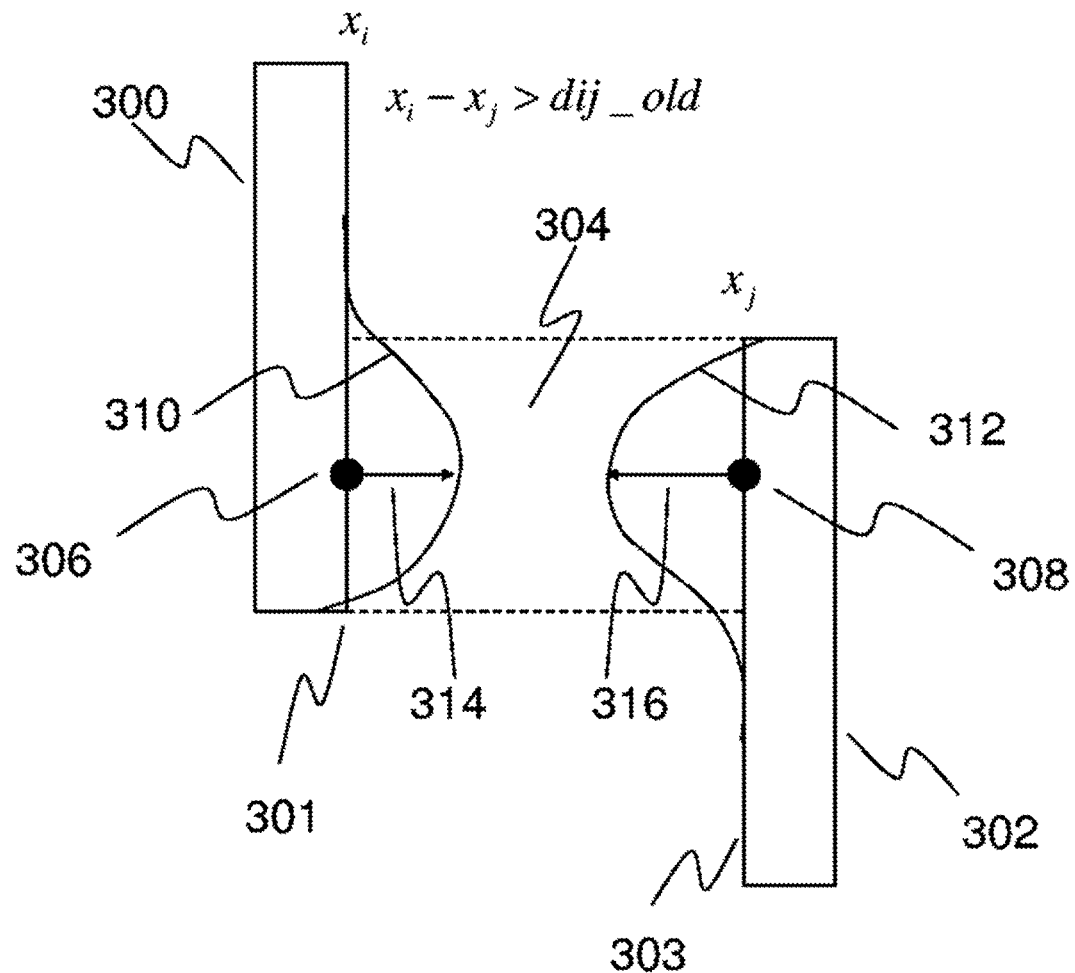
FIG. 3 is a schematic diagram illustrating the calculation of local process modification values.
Figure 4:
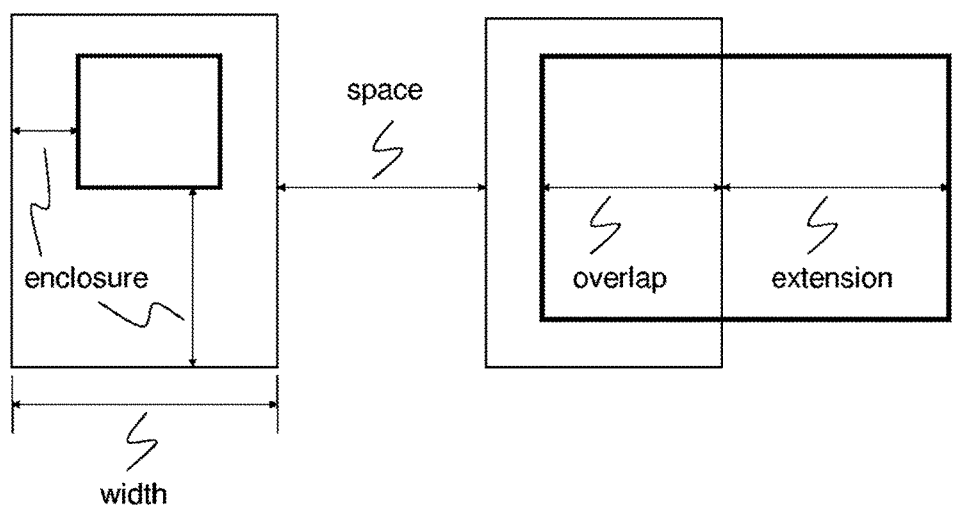
FIG. 4 illustrates the layout artwork terminology.

In another preferred embodiment, we select the control points by inspecting the interaction among the edges. FIG. 3 shows two layout rectangles 300 and 302, which can be on the same layer or on different layers in the layout. The constraint relation xi-xj>dij_old applies to these two edges.

The interaction region between the right edge of 300 at xi (301) and the left edge of 302 at xj (303) is defined by the shadow of 301 on 303, as marked by the band between the two dashed lines, 304. We find the shadow region by placing a hypothetical flashlight to the left of 301 and measure its shadow on 303, which is similar to the procedure used in constraint generation in block 004 of FIG. 1.

After finding the interaction region, we implement a predetermined sampling plan for laying down the control points. In FIG. 3, we place a pair of control points 306 and 308, one on each edge, at the same height, in the middle of the shadow band. We can also use other spatial sampling plans involving a plurality of pairs of points.

After deciding the sampling points (e.g. 306 and 308 in FIG. 3), we simulate various processing response variables at these points. In the photolithography step of IC fabrication, said response variables represent local printability and comprise edge placement error, light intensity during photolithography exposure and its derivatives, contrast, and mask error enhancement factor. A predetermined empirical function is used to calculate the local process modification value from said processing response variables.

For the example in FIG. 3, we select a linear function of edge placement error at point 306 and 308 to calculate local process modification. Edge placement error, (314/316 for the left/right edge) is defined as the perpendicular distance from intended edge location (xi/xj for the left/right edge) to the simulated edge location as predicted by process simulation, (310/312 for the left/right edge).

Once the edge placement errors are calculated for the two interacting edges, the local process modification value is expressed as $w1*EPE\_i+w2*EPE\_j$, where EPE_i 314 and EPE_j 316 are the edge placement errors at 306 and 308 respectively, and w1 and w2 are user specified constants. Local constraint for edges 301 and 303 can now be expressed as $dij\_new=dij\_old+w1*EPE\_i+w2*EPE\_j$.

Variations in functional forms for local process modification can be constructed and additional process variables can be used in order to cover the specific needs of a particular application.

In another preferred embodiment, the local process modification value is obtained from a predetermined look-up data table. The key to the look-up data table is a set of geometry combinations that appear frequently in the layout, such as the two rectangle case show in FIG. 3. The application uses pattern recognition capability to identify the pattern key and search the look-up table in order to obtain appropriate local process modification value. This embodiment is advantageous when good simulation accuracy cannot be obtained, and the interaction is limited to a short range.

The local process modifications discussed so far are microscopic correction to the design rule constraints. In modern processing technology, there are also systematic corrections to design rules on a larger scale. For example, in immersion lithography, one can utilize the polarization property of the imaging light to achieve higher image resolution in a preferred direction. Another example is the crystal orientation dependence in device performance. According to the present invention, we formulated two sets of design rule distances, one set for horizontal dimensions and another set for vertical dimensions in order to achieve best chip performance. We construct physical layout tools to utilize these two separate constraint distances. The optimal layout for these technologies are anisotropic in that the horizontal and vertical directions obey different constraints for minimal space, line width, overlap, enclosure, and extension rules. The exact definition of these geometry terms are listed in Definition List 1 and illustrated in FIG. 4.

Design rules that have different constraint distances for horizontal and vertical directions are defined as anisotropic design rules. The layout that satisfy anisotropic design rules are defined as anisotropic layout.

Design rules that have the same constraint distances for horizontal and vertical directions are defined as isotropic design rules, or simply design rules. The layouts that satisfy isotropic design rules are defined as isotropics layout.

The present invention comprises layout systems that are capable of generating and optimizing layout artwork for a direction dependent processing technology.

In accordance with the current invention, we design a set of simple test patterns with parameterized critical dimensions. The parameter values are selected such that they vary from the value when said pattern can be successfully fabricated to a value at which the fabrication clearly fails. We extract the design rules by finding and recording the parameter value at which the test pattern can be successfully fabricated under all allowable processing conditions, i.e., the process window.

In a preferred embodiment, two separate sets of test patterns are fabricated. One set comprises geometries oriented along the vertical direction. The other set comprises geometries oriented along the horizontal direction. For example, one set has line and space gratings running along the vertical direction; the other set has the same running along horizontal direction. The variable parameters in this example are line width and space width. Extracted design rules from this set of test patterns represent distance constraints for line width and space width in horizontal and vertical directions.

For a direction dependent processing technology, the present invention extracts two distinctive sets of constraint parameters to form an anisotropic design rule set.

Figure 5:
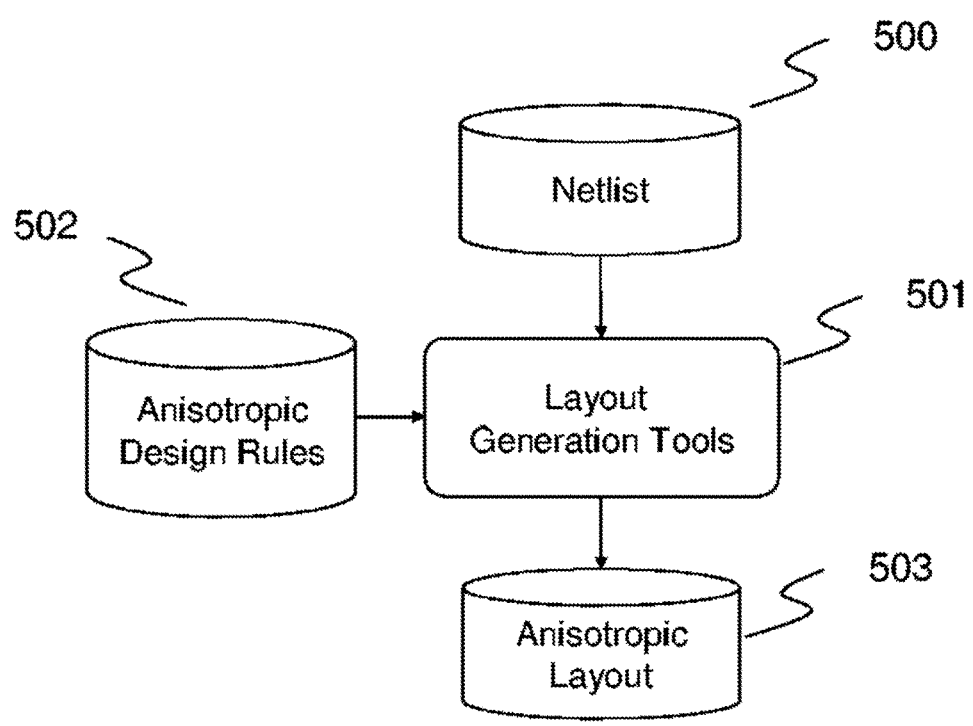
FIG. 5 is a block diagram for generating anisotropic layout artwork.

FIG. 5 shows a flow diagram for generating optimal layout for a direction dependent processing technology. Starting with design database that contains the circuit netlist and performance target (500), we apply a set of software tools (501) to create a polygonal layout for fabrication. These tools comprise layout editors, placement and routing tools, layout compaction tools, and standard cell generators etc. The tool collection (501) uses anisotropic design rules (502) to restrict the relative positioning of polygon edges based on the orientation of the edge.

Figure 6:
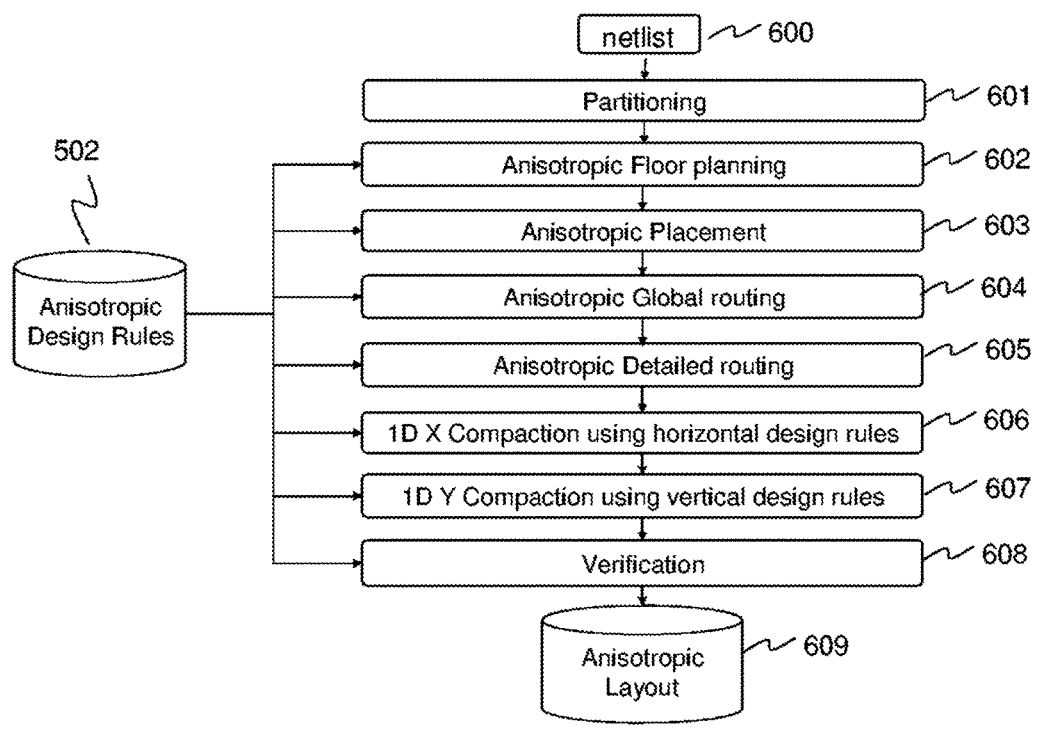
FIG. 6 is a flow diagram for anisotropic layout generation.

In a preferred embodiment, FIG. 6 shows a flow diagram for generating layout for an anisotropic image system. The steps performed in FIG. 6 uses a subset of the tool collection 501.

During floor planning (602) and placement (603), a preferred orientation of the image system is used to optimize the shape, position and orientation of the circuit building blocks. More circuit element can be accommodated in the direction with higher resolution, while the direction with lower resolution has lower line-to-line parasitic capacitance and lower resistance. In routing modules 604 and 605, wiring direction dependent design rules from the memory are used for identifying obstacles, setting wire width and spacing, and estimating resistance and capacitance.

Figure 7A:
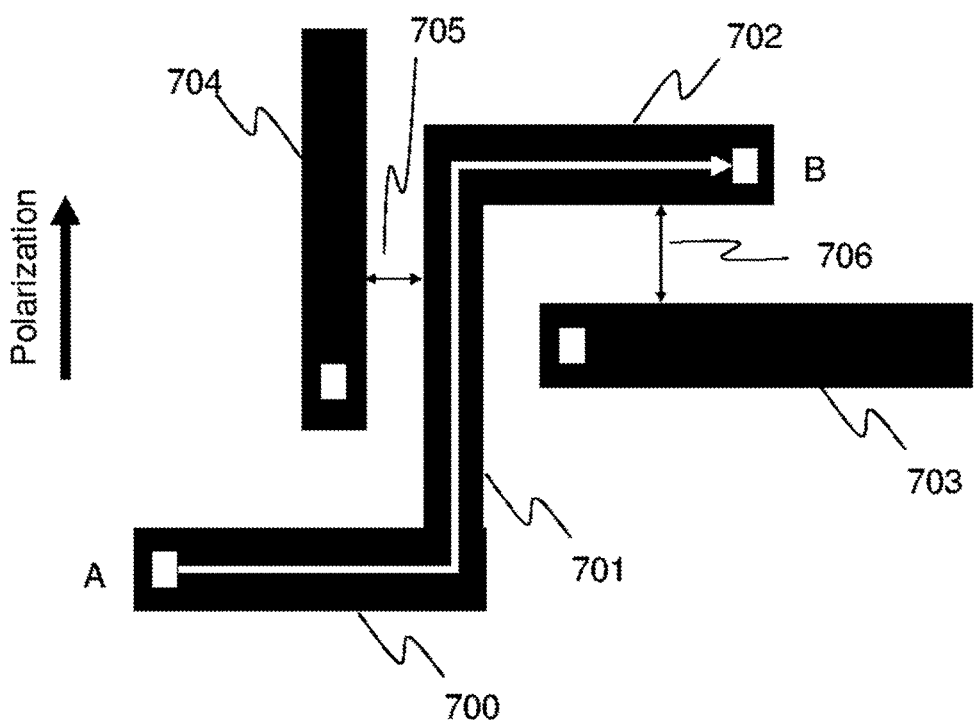
FIG. 7A illustrates orientation dependent routing.

FIG. 7A shows a basic operation during wire routing. A wire is constructed by the routing algorithm to connect two points, A and B. In a preferred embodiment, starting from point A, while the wire is running horizontally (700), the application fetches the minimal width of the horizontal wire from the memory and applies it to limit the current wire segment. After turning 90 degrees (701), the wire now is running along the vertical direction, the application fetches the minimal width of the vertical wire from a different memory location and applies it to limit the minimal line width.

The wire is also kept at safe distances away from obstacles 703 and 704 using directional dependent minimal spacing rules. In a preferred embodiment, the layout generation system compares the separation 705 between vertical line segments 701 and 704, with the minimal spacing rule between vertical lines and reports error when this horizontal constraint is violated. Said system compares the separation 706 between horizontal line segments 702 and 703, with the minimal spacing rule between horizontal lines and reports error when this vertical constraint is violated. In prior art physical design systems, the minimal values for 705 and 706 are the same and equal to the minimal space rule, which is kept at the same memory location in the design system.

Figure 7B:
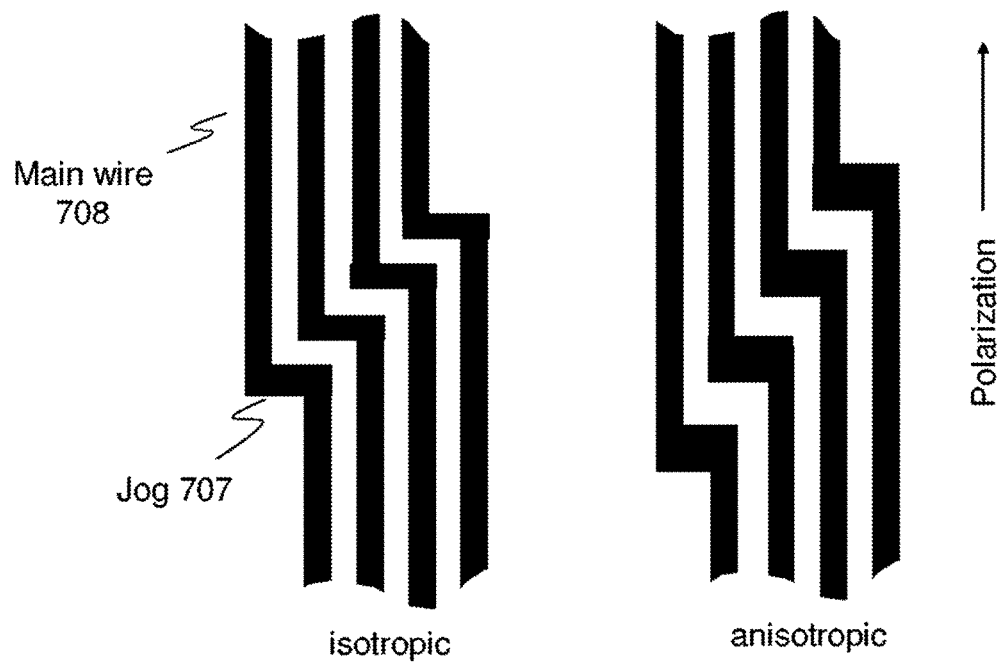
FIG. 7B illustrates orientation dependent jog insertion.

FIG. 7B illustrates the procedure for wire jog insertion. In layout systems, interconnect needs to be converted from paths that have no width information to actual layout wires. The preferred width is specified in the technology file. In a preferred embodiment, two numbers representing preferred wire width in vertical and in horizontal direction are read from different input fields. During path to wire conversion, the main wire portion 708 uses width and spacing width for the vertical wires, while jog portion 707 uses width and spacing rules for horizontal wires.

In another preferred embodiment, design rule verification and compaction programs in FIG. 6 are constructed to accept and process anisotropic design rules. For example, the corner to corner constraint on a layout layer may now be expressed as sqrt(d_h*d_h+d_v*d_v), where d_h and d_v ate horizontal and vertical constraint distances respectively. In contrast, in an isotropic layout system, said corner constraint is sqrt(2)*d0, where d0 is the isotropic constraint distance.

Figure 8:
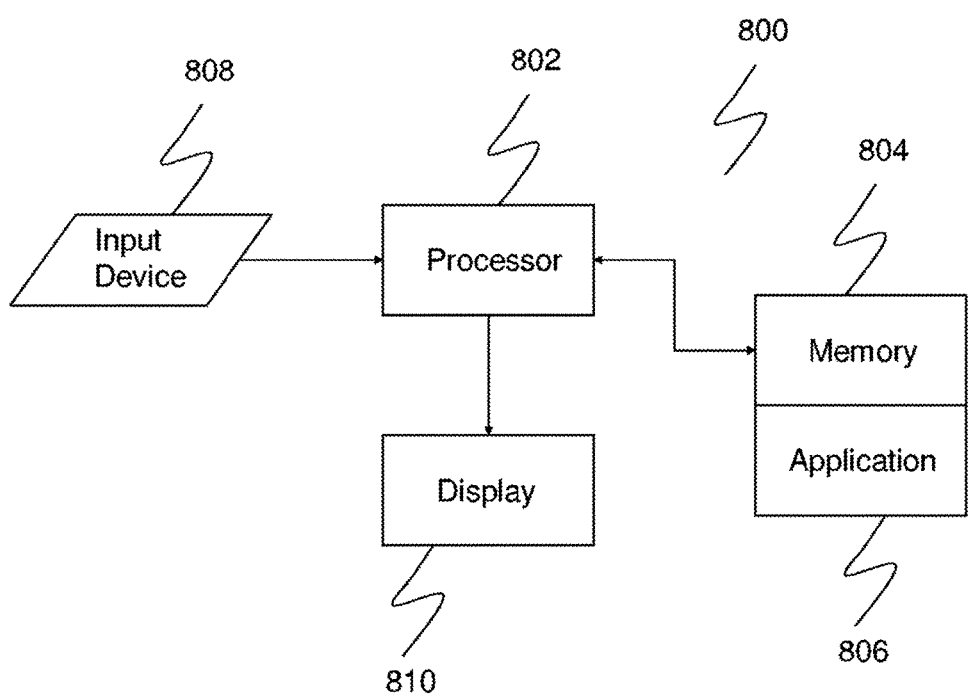
FIG. 8 is a block diagram showing a system for implementing the present invention.

Referring to FIG. 8, a block/flow diagram is shown for a system 800 of the present invention. System 800 includes a processor 802 that accesses memory device 804. Memory device 804 stores an application software package 806 for implementing the present invention. A user interfaces with the processor 802 through an input device 808 which may include a keyboard, a mouse, a touch screen monitor, a voice recognition system or other known input devices. A display 810 is also included to display results, prompts, user inputs, graphics, etc.

While the present invention has been described in detail with regards to the preferred embodiments, it should be appreciated that various modifications and variations may be made in the present invention without departing from the scope or spirit of the invention. In this regard, it is important to note that practicing the invention is not limited to the applications described hereinabove. Many other applications and/or alterations may be utilized if such other applications and/or alterations do not depart from the intended purpose of the present invention.

It should further be appreciated by a person skilled in the art that features illustrated or described as part of one embodiment can be used in another embodiment to provide yet another embodiment such that the features are not limited to the specific embodiments described above. Thus, it is intended that the present invention cover such modifications, embodiments and variations as long as such modifications, embodiments and variations come within the scope of the appended claims and their equivalents.

What is claimed is:

1. A method of increasing manufacturability of a design layout of an integrated circuit product fabricated using a manufacturing process performed by an integrated circuit fabrication system, comprising:
defining an original design layout based on original design rules associated with the manufacturing process, the original design rules comprising at least global limits on relative distance between layout objects, and a design layout process comprising at least one optimization process on features of the original design layout;
generating a modified design layout by an automated design layout system, based at least on the original design layout, the original design rules, and a set of location-specific limits on relative distance between layout objects of the original design layout which are looked up from a predetermined table using patterns of layout objects in the original design layout defined by the design layout process, as look-up keys; and
outputting the modified design layout in a format suitable for use by the integrated circuit fabrication system to fabricate the integrated circuit product.

2. The method according to claim 1, wherein the at least one optimization process optimizes according to an objective function.

3. The method according to claim 1, further comprising manufacturing the integrated circuit product by the integrated circuit fabrication system based on the modified design layout.

4. The method according to claim 3, wherein the original design layout has a process latitude, with respect to the integrated circuit fabrication system, and the modified design layout has an improved process latitude over the original design layout.

5. The method according to claim 1, wherein the set of location-specific limits on relative distance between layout objects of the original design layout are anisotropic.

6. The method according to claim 1, wherein the original design layout comprises a first plurality of routing wires running in a first direction, and a second plurality of routing wires running in a second direction, the second direction being orthogonal to the first direction, the routing wires of the first plurality of routing wires having first width values, the routing wires of the second plurality of routing wires having second width values, the first width values being substantially different from the second width values.

7. The method according to claim 6, wherein the step of generating a modified design layout comprises locally adjusting at least a width value of at least one of the first plurality of routing wires.

8. The method according to claim 6, wherein the step of generating a modified design layout comprises locally adjusting at least a spacing value between a pair of the first plurality of routing wires.

9. The method according to claim 1, wherein the original design layout comprises interrelated layout objects organized in a hierarchical structure including master instances, cell instances, and array instances.

10. The method according to claim 1, wherein the patterns of layout objects within the original design layout comprises interrelated layout objects on one layer of the original design layout.

11. The method according to claim 10, wherein the patterns of layout objects within the design layout comprises a combination of geometry of adjacent layout objects within the original design layout.

12. The method according to claim 1, wherein the patterns of layout objects are determined by performing automated pattern recognition.

13. The method according to claim 12, wherein the automated pattern recognition comprises recognizing combinations of geometry in the original design layout.

14. The method according to claim 1, wherein:
the original design rules comprise a minimum safeguard distance limit; and
the step of generating a modified design layout by an automated design layout system comprises generating an additional safeguard distance, and adding the additional safeguard distance to the minimum safeguard distance limit.

15. The method according to claim 1, wherein the original design rules are adapted for a particular manufacturing process, wherein occurrences of the patterns within the original design layout represent regions having a first local process latitude for the particular manufacturing process, and at least some of corresponding regions of the modified latitude represent regions of having a second local process latitude for the particular manufacturing process, wherein the second local process latitude is improved over the first local process latitude.

16. The method according to claim 1, further comprising further modifying the modified design layout selectively in at least one location of the modified design layout which limits a process latitude with respect to a photolithography process, dependent on a circuit tolerance at the at least one location.

17. The method according to claim 1, wherein said step of generating the modified design layout comprises modifying the original design layout by optimization according to an optimization objective in a presence of constraints imposed by at least the pattern-specific design rules.

18. The method according to claim 1, wherein said step of generating the modified design layout causes at least one new violation of the original design rules comprising at least global limits on relative distance between layout objects, further comprising optimizing the modified design layout according to at least one optimization objective.

19. The method according to claim 18, wherein the at least one optimization objective comprises wire length minimization, legalization, and compaction of the modified design layout.

20. A method of producing a mask design layout for an integrated circuit product for fabrication by an integrated circuit fabrication system according to a manufacturing process, comprising:
storing in a memory, a description of an original mask design layout based on original mask design rules associated with the manufacturing process, the original mask design rules comprising at least:
global limits on relative distance between layout objects within the mask design layout, and
a mask design layout process comprising at least one optimization process on features of the original mask design layout;
looking up a set of location-specific limits on relative distance between layout objects of the original mask design layout from a predetermined table, using patterns of layout objects in the original mask design layout defined by the mask design layout process, as look-up keys;
generating, by an automated mask design layout system, a modified mask design layout from the original mask design layout, wherein the set of location-specific limits on relative distance between layout objects of the original mask design layout regionally modify the original mask design rules; and
outputting the modified mask design layout in a format suitable for use by the integrated circuit fabrication system to fabricate the integrated circuit product.

21. The method according to claim 20, wherein said generating comprises employing at least one optimization process which optimizes modified regions of the mask design layout according to an objective function.

22. The method according to claim 21, further comprising manufacturing a modified mask design according to the modified mask design layout.

23. The method according to claim 22, further comprising employing the modified mask design in an integrated circuit manufacturing process having a predetermined process latitude dependent on a relative distance between layout objects represented in the modified mask design and respective features of adjacent respective layout objects to manufacture an integrated circuit, wherein the modified mask design regionally increases the relative distance with respect to the original mask design between layout objects represented in the modified mask design layout, selectively dependent on the respective features in a respective region of the original mask design layout, when an automated processor predicts, based on the predetermined table, an insufficient process latitude to reliably manufacture the integrated circuit.

24. The method according to claim 20, further comprising manufacturing the integrated circuit product by the circuit fabrication system based on the modified design layout.

25. The method according to claim 20, wherein the original design layout has a process latitude at a specific location, with respect to the integrated circuit fabrication system, and the modified design layout has an improved process latitude over the original design layout at the specific location.

* * * * *

UNITED STATES PATENT AND TRADEMARK OFFICE
CERTIFICATE OF CORRECTION

PATENT NO. : 10,216,890 B2
APPLICATION NO. : 15/903674
DATED : February 26, 2019
INVENTOR(S) : Qi-De Qian Page 1 of 1

It is certified that error appears in the above-identified patent and that said Letters Patent is hereby corrected as shown below:

In the Specification

Column 1, Line 17, cancel "divisional" and replace with --continuation-in-part--.

Signed and Sealed this
Thirtieth Day of July, 2019

Andrei Iancu
*Director of the United States Patent and Trademark Office*